United States Patent [19]
Saito et al.

[11] Patent Number: 5,500,633
[45] Date of Patent: Mar. 19, 1996

[54] MAGNETORESISTANCE EFFECT ELEMENT

[75] Inventors: Yoshiaki Saito; Koichiro Inomata, both of Yokohama; Shiho Okuno, Fujisawa; Yoshinori Takahashi, Yokohama, all of Japan

[73] Assignee: Kabushiki Kaisha Toshiba, Kawasaki, Japan

[21] Appl. No.: 323,809

[22] Filed: Oct. 17, 1994

Related U.S. Application Data

[63] Continuation-in-part of Ser. No. 100,427, Aug. 2, 1993, Pat. No. 5,365,212.

[30] Foreign Application Priority Data

| Aug. 3, 1992 | [JP] | Japan | 4-206441 |
| Aug. 3, 1992 | [JP] | Japan | 4-206442 |
| Feb. 26, 1993 | [JP] | Japan | 5-061225 |

[51] Int. Cl.⁶ .................................................. H01L 43/00
[52] U.S. Cl. ........................................ 338/32 R; 324/252
[58] Field of Search .................... 338/32 R; 324/207.21, 324/251, 252; 73/779

[56] References Cited

U.S. PATENT DOCUMENTS

| 4,949,039 | 8/1990 | Grünberg | 324/252 |
| 5,168,760 | 12/1992 | Wun-Fogle et al. | 73/779 |
| 5,206,590 | 4/1993 | Dieny et al. | 324/252 |
| 5,243,316 | 9/1993 | Sakakima et al. | 338/32 R |
| 5,373,238 | 12/1994 | McGuire et al. | 324/252 |
| 5,381,125 | 1/1995 | Chen et al. | 338/32 R |

*Primary Examiner*—Marvin M. Lateef
*Attorney, Agent, or Firm*—Oblon, Spivak, McClelland, Maier & Neustadt

[57] ABSTRACT

A magnetoresistance effect element includes a multilayer stack of alternating magnetic and nonmagnetic layers, and having a mixture layer constituted by a mixture of a ferromagnetic element and a non-ferromagnetic element interposed between adjacent stacked magnetic and non-magnetic layers so as to exhibit a magnetoresistance effect. The multilayered stack includes at least two magnetic layers, at least two mixture layers, and at least one non-magnetic layer. $2(X_1/X_n)/n$ is larger than 1.1 where n is the number of atomic layers of the mixture layer, $X_1$ is an atomic concentration (%) of the ferromagnetic element of an atomic layer closest to the magnetic layer, and $X_n$ is an atomic concentration (%) of the ferromagnetic element of the n-th atomic layer closest to the non-magnetic layer.

31 Claims, 20 Drawing Sheets

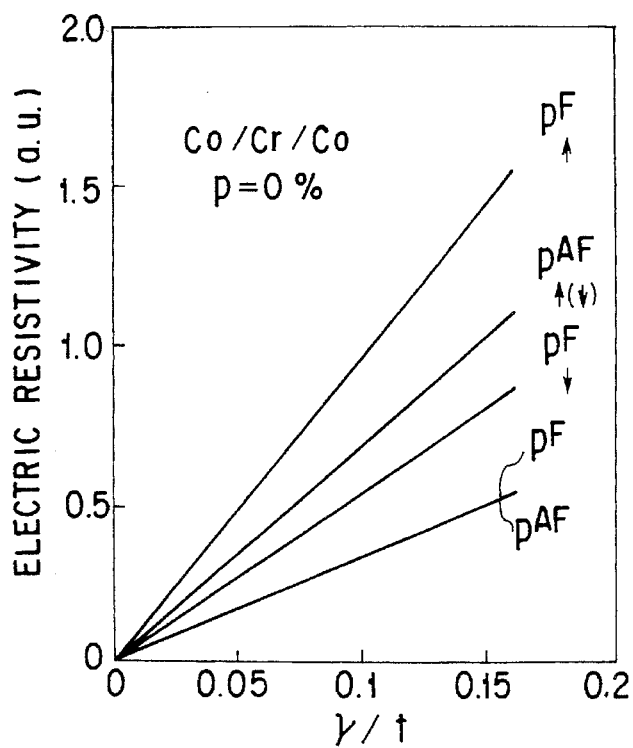
F I G. 6A
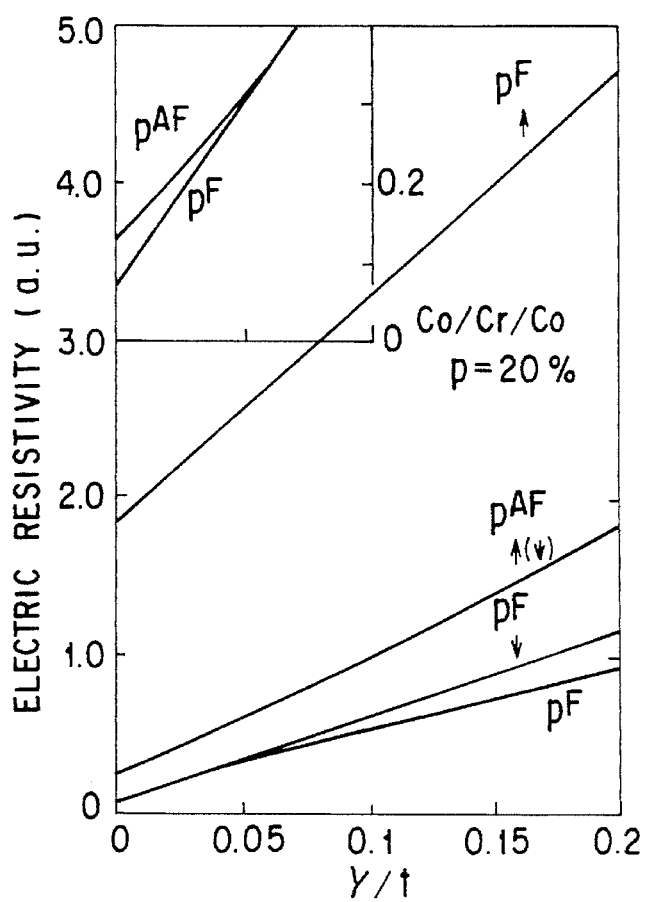
F I G. 6B

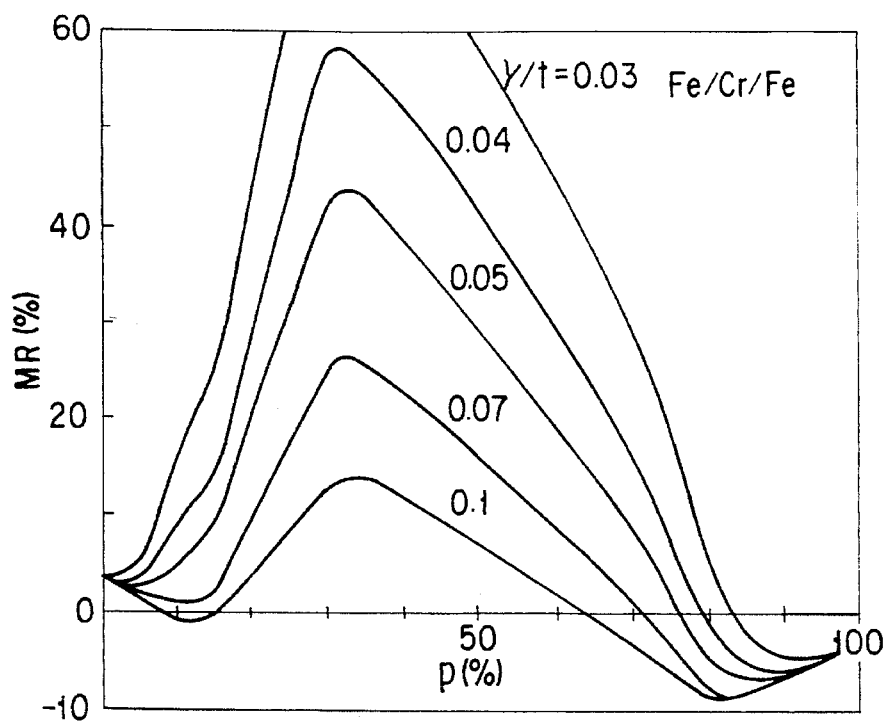
F I G. 7
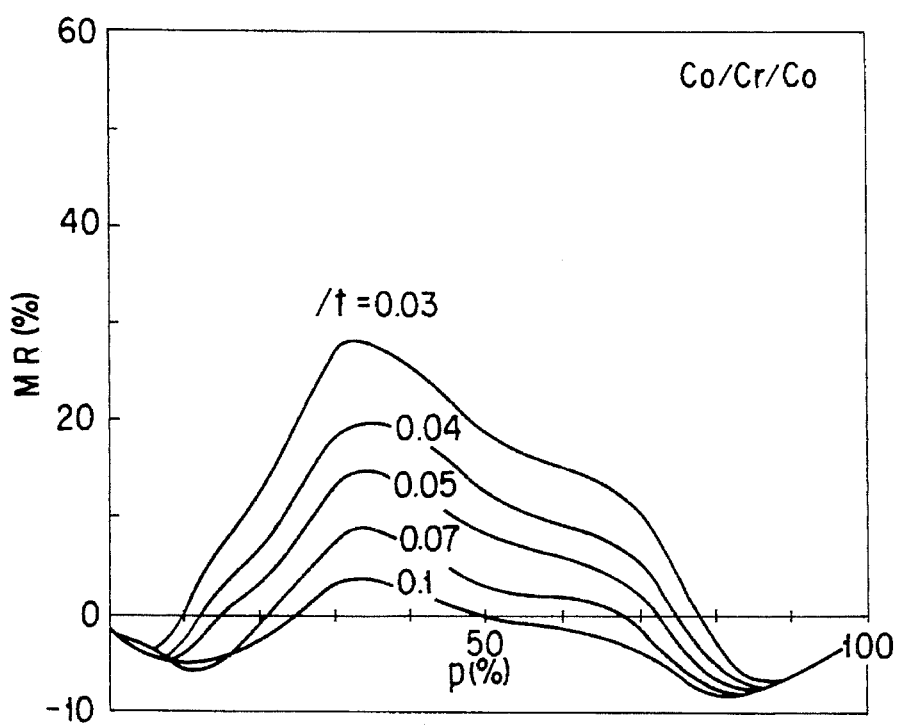
F I G. 8

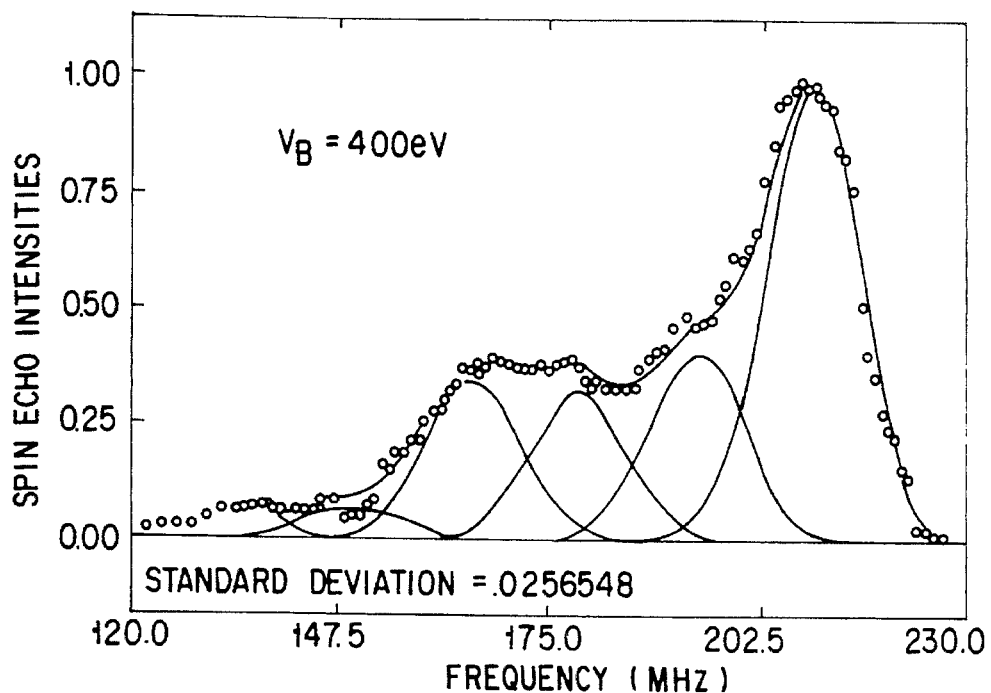
F I G. 9
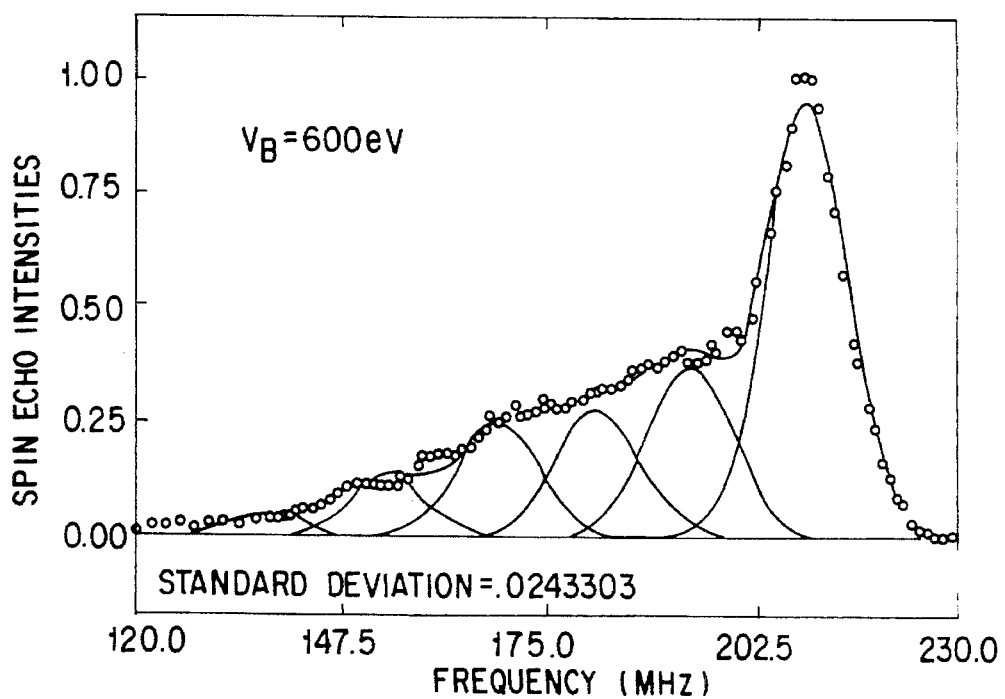
F I G. 10

$V_B = 400 eV$

MIXTURE LAYER

MIXTURE LAYER 2

MIXTURE LAYER 3

MIXTURE LAYER 4

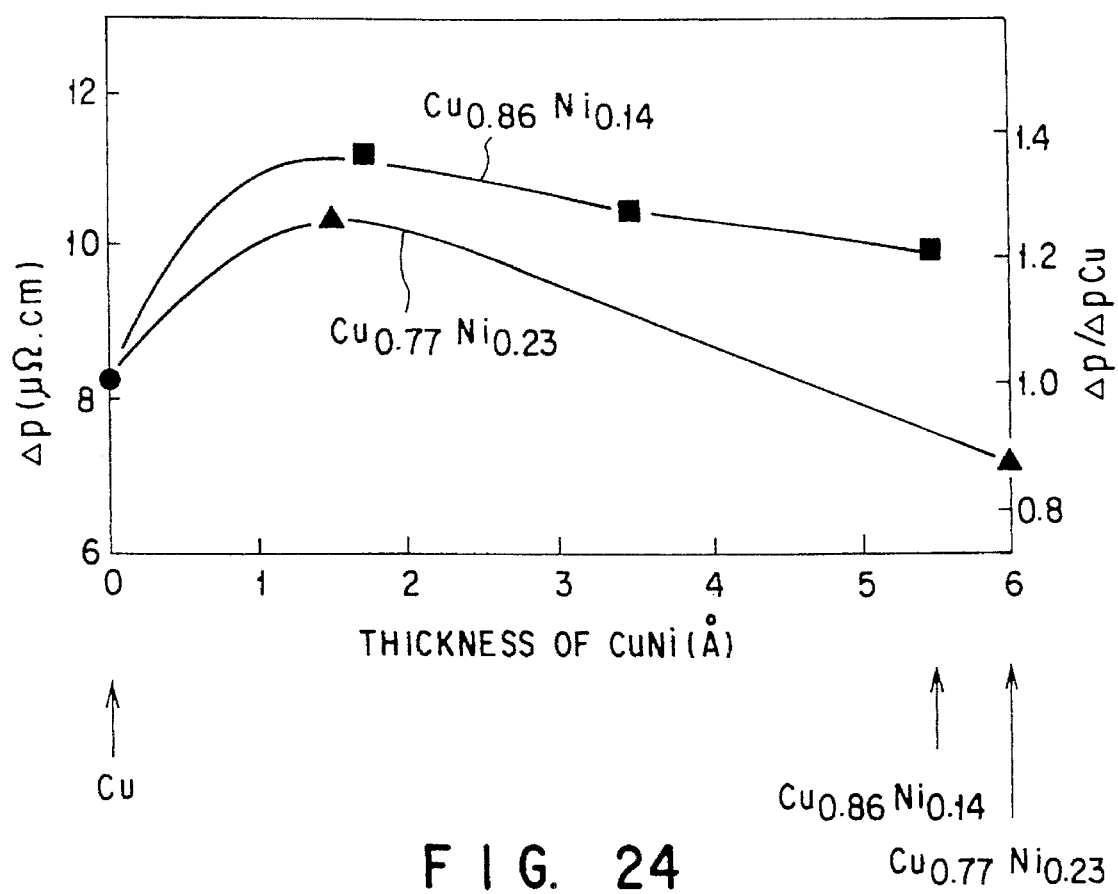
F I G. 24
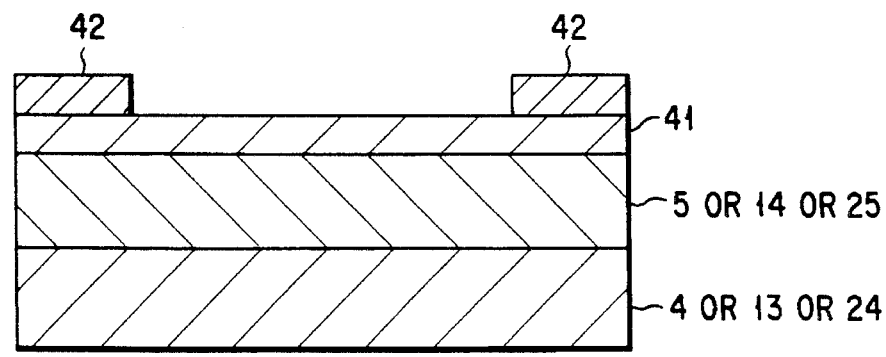
F I G. 25

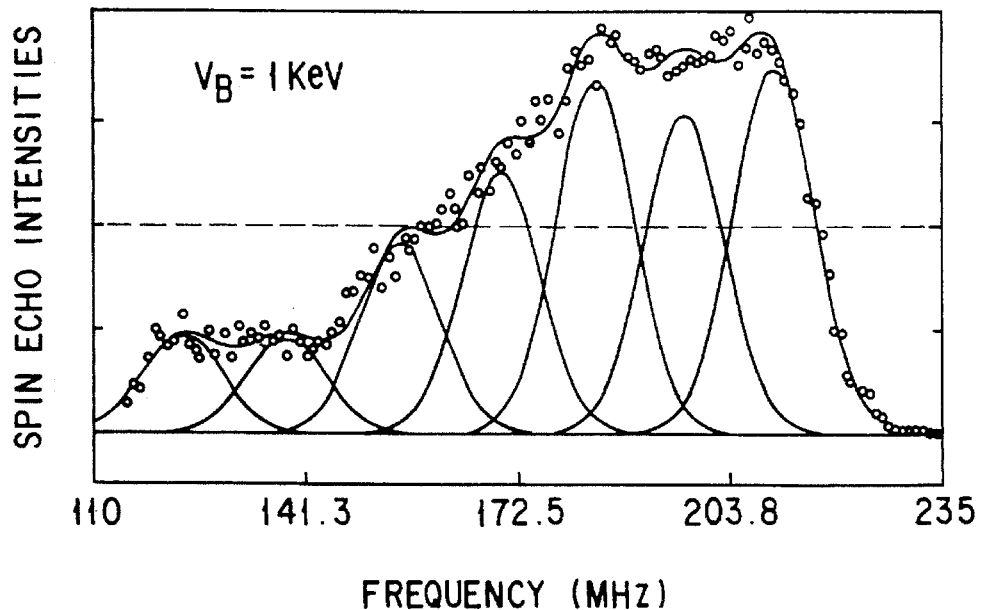
F I G. 29
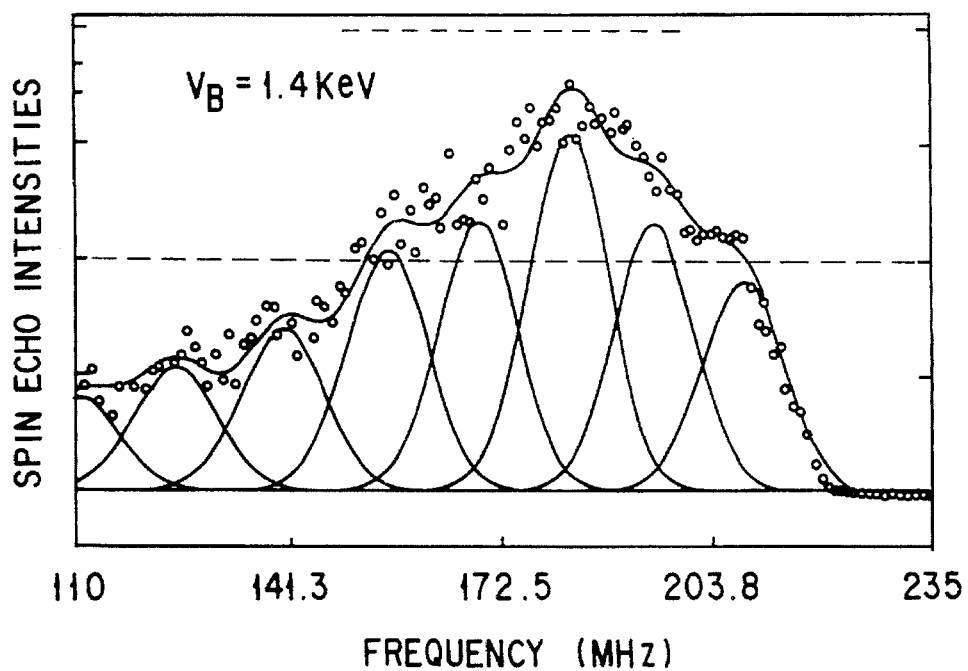
F I G. 30

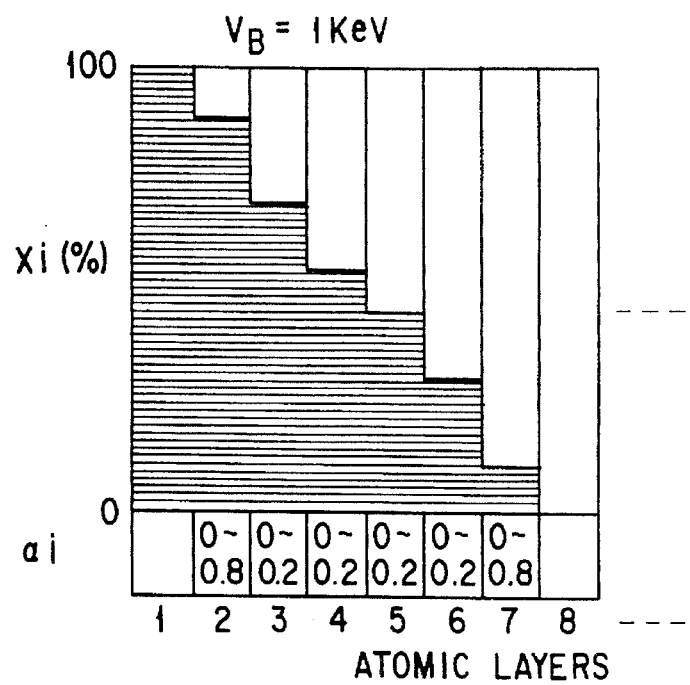
F I G. 34
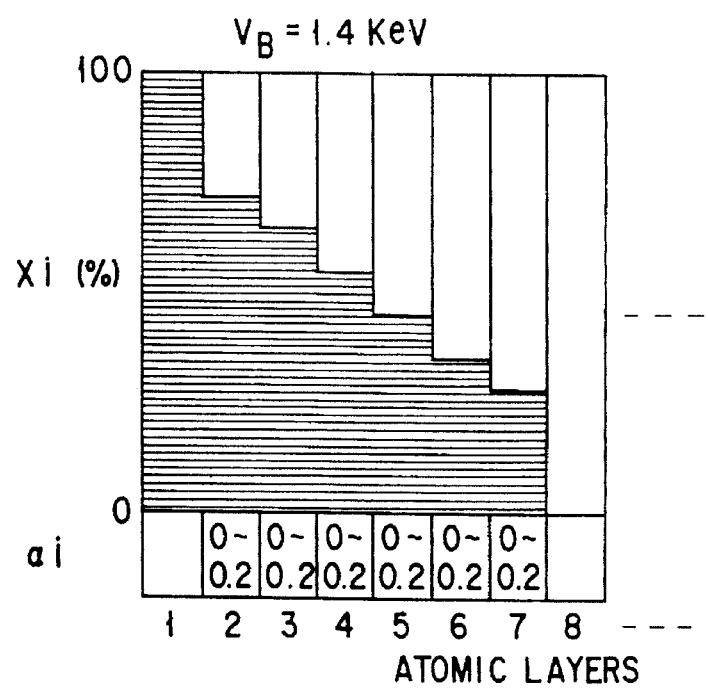
F I G. 35

MAGNETORESISTANCE EFFECT ELEMENT

CROSS-REFERENCE TO THE RELATED APPLICATIONS

This application is a continuation-in-part of U.S. patent application Ser. No. 08/100,427 filed on Aug. 2, 1993, now U.S. Pat. No. 5,365,212.

BACKGROUND OF THE INVENTION

1. Field of the Invention

The present invention relates to a magnetoresistance effect element having a magnetic artificial lattice film and a high magnetoresistance ratio.

2. Description of the Related Art

Magnetoresistance effect elements utilizing the magnetoresistance effect have been used in a variety of applications such as a magnetic sensor and a magnetic head. A magnetoresistance effect element using a magnetic body has excellent temperature stability and a wide temperature range. A permalloy thin film exhibiting a magnetoresistance ratio of about 2% has been widely used in a conventional magnetoresistance effect element using a magnetic body. However, a sufficient high sensitivity cannot be obtained with this element because the permalloy thin film has a low magnetoresistance ratio.

To the contrary, in recent years, an artificial lattice film having a multilayered structure consisting of magnetic and non-magnetic layers alternately stacked on each other at a period on the order of several to several tens of Å such that upper and lower magnetic layers are magnetically coupled through a corresponding non-magnetic metal layer in an anti-parallel manner has received a great deal of attention because the artificial lattice film exhibits a great magnetoresistance effect. Artificial lattice films such as $(Fe/Cr)_n$ (Phys. Rev. Lett., Vol. 61, p. 2472 (1988)), and $(Co/Cu)_n$ (J. Mag. Mag. Mat., Vol. 94, p. 1.1 (1991)) have been developed. These films have a magnetoresistance effect 10 times or more that of a conventional permalloy thin film. When applications to a magnetoresistance effect element or the like are taken into consideration, the magnetoresistance effect of the conventional artificial lattice film is not yet sufficient. This artificial lattice film has a saturation magnetic field as large as several kOe. For this reason, in applications to magnetoresistance effect elements, it is difficult to obtain a high sensitivity with a small change in magnetic field.

SUMMARY OF THE INVENTION

The present invention has been made in consideration of the above situation, and has as its object to provide a magnetoresistance effect element capable of obtaining a high magnetoresistance ratio.

It is another object of the present invention to provide a magnetoresistance effect element having a low saturation magnetic field level and capable of obtaining a high magnetoresistance ratio with a small change in magnetic field.

According to the first aspect of the present invention, there is provided a magnetoresistance effect element comprising a multilayer stack of alternating magnetic and non-magnetic layers, and having a mixture layer constituted by a mixture of a ferromagnetic element and a non-ferromagnetic element interposed between adjacent stacked magnetic and non-magnetic layers so as to exhibit a magnetoresistance effect, wherein the multilayer stack includes at least two the magnetic layers, at least two the mixture layers, and at least one the non-magnetic layer, and wherein $2(X_1/X_n)/n$ is larger than 1.1 where n is the number of atomic layers of the mixture layer, $X_1$ is an atomic concentration (%) of the ferromagnetic element of an atomic layer closest to the magnetic layer, and $X_n$ is an atomic concentration (%) of the ferromagnetic element of the n-th atomic layer closest to the non-magnetic layer.

According to the second aspect of the present invention, there is provided a magnetoresistance effect element comprising a multilayer stack of alternating magnetic layers and at least one nonmagnetic layer, the at least one magnetic layer containing a metal element or an alloy thereof wherein the metal element or alloy thereof is magnetically polarized in a non-ferromagnetic matrix metal material due to the presence of the magnetic layer, the multilayer exhibiting a magnetoresistance effect.

According to the third aspect of the present invention, there is provided a magnetoresistance effect element comprising a multilayer stack of alternating magnetic layers and at least one first non-magnetic layer, and having second non-magnetic layers interposed between adjacent magnetic and first non-magnetic layers, wherein the second non-magnetic layers contain a metal element or an alloy thereof wherein the metal element or alloy thereof is magnetically polarized in a non-ferromagnetic matrix metal material due to the presence of the magnetic layer, the multilayer exhibiting a magnetoresistance effect.

According to the present invention, there are provided a magnetoresistance effect element capable of obtaining a high magnetoresistance ratio and a magnetoresistance effect element having a low saturation magnetic field level and capable of obtaining a high magnetoresistance ratio with a small change in magnetic field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are graphs showing the relationships between the electric resistivities and bulk scattering factors in Co/Cr systems as examples of the computer simulation in FIG. 4;

FIG. 7 is a graph showing the simulation result of the influence of a mixture layer on the MR value in the Fe/Cr system:

FIG. 8 is a graph showing the simulation result of the influence of a mixture layer on the MR value in the Co/Cr system;

FIG. 9 is a graph showing the frequency dependency of the $^{59}$Co nuclear spin echo intensity of a multilayered film a in Example 2;

FIG. 10 is a graph showing the frequency dependency of the $^{59}$Co nuclear spin echo intensity of a multilayered film b in Example 2;

FIG. 24 is a graph showing a change in Δρ at 77K when the thickness of each Cu$_{1-x}$Ni$_x$ is changed from 0 to 6Å so as to set the total thickness of Cu$_{1-1}$Ni$_x$/Cu/Cu$_{1-x}$Ni$_x$ corresponding to the first peak of anti-ferromagnetic coupling;

FIG. 25 is a sectional view showing the layered structure of a magnetoresistance effect element according to another embodiment of the present invention;

FIGS. 26 to 30 are graphs showing the frequency dependency of the $^{59}$Co nuclear spin echo intensities of multilayers in Example 6; and FIGS. 31 to 35 are views showing the concentration distributions of magnetic atoms of the multilayers in Example 6.

DETAILED DESCRIPTION OF THE PREFERRED EMBODIMENTS

Preferred embodiments of the present invention will be described in detail with reference to the accompanying drawings.

According to the first embodiment of the present invention, there is provided a magnetoresistance effect element comprising a multilayer stack of alternating magnetic and non-magnetic layers, and having a mixture layer constituted by a mixture of a ferromagnetic element and a non-ferromagnetic element interposed between adjacent stacked magnetic and non-magnetic layers so as to exhibit a magnetoresistance effect, wherein said multilayer stack includes at least two said magnetic layers, at least two said mixture layers, and at least one said non-magnetic layer, and wherein $2(X_1/X_n)/n$ is larger than 1.1 where n is the number of atomic layers of said mixture layer, $X_1$ is an atomic concentration (%) of said ferromagnetic element of an atomic layer closest to said magnetic layer, and $X_n$ is an atomic concentration (%) of said ferromagnetic element of the n-th atomic layer closest to said nonmagnetic layer.

This structure is based on the finding of the present inventors that when each mixture layer of a predetermined ferromagnetic element and a predetermined non-ferromagnetic element is formed between the magnetic layer and the non-magnetic layer, the multilayer exhibits higher magnetoresistance ratio.

More specifically, $2(X_1/X_n)/n$ is larger than 1.1 where n is the number of atomic layers of the mixture layer formed between the magnetic layer and the non-magnetic layer, $X_1$ is an atomic concentration (%) of the ferromagnetic element of an atomic layer closest to the magnetic layer, and $X_n$ is an atomic concentration (%) of the ferromagnetic element of an n-th atomic layer closest to the non-magnetic layer. Therefore, a very high magnetoresistance ratio can he obtained.

Figure 1:
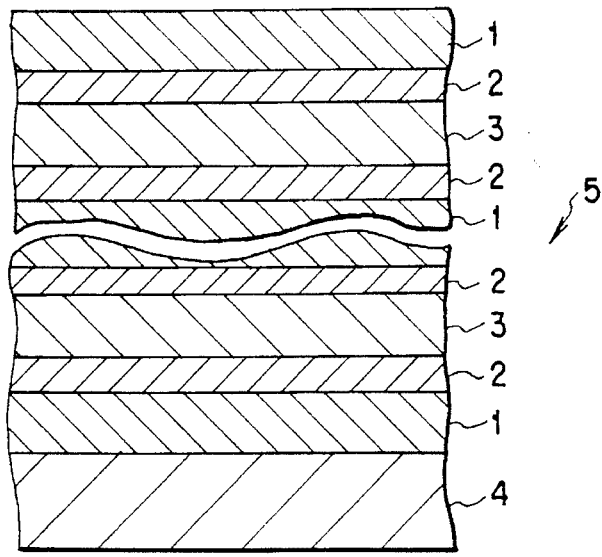
FIG. 1 is a sectional view showing the layered structure of a magnetoresistance effect element according to the first embodiment of the present invention.

FIG. 1 is a sectional view showing magnetoresistance effect element according to the first embodiment of the present invention. This magnetoresistance effect element has a multilayer 5 in which a magnetic layer 1, a mixture layer 2, and a non-magnetic layer 3 are repeatedly stacked on a substrate 4.

It should suffice if the multilayer 5 includes at least five layers of a magnetic layer 1/a mixture layer 2/a non-magnetic layer 3/a mixture layer 2/a magnetic layer 1. Further, adjacent magnetic layers may or may not be anti-ferromagnetically coupled with each other. Examples of the non-coupling type multilayer having no anti-ferromagnetic coupling between magnetic layers are the Shinjo type (T. Shinjo and H. Yamamoto, J. Phys. Soc. Jpn. 59.3061 (1990)), and the Spin valve type (B. Dieny, V. S. Speriosu, S. S. P. Parkin, B. A. Gurney, D. R. Wilhoit and D. Mauri: Phys. Rev. B. 43, 1297 (1991)).

The Shinjo type has a structure in which at least one relatively hard magnetic layer and at least one relatively soft magnetic layer are alternately stacked one on another, with a non-magnetic layer being interposed between each adjacent pair of soft and hard magnetic layers, such as to substantially cut off the magnetic coupling between magnetic layers. When a particular magnetic field is applied, an anti-parallel magnetization can be created between adjacent magnetic layers since a hard magnetic layer and a soft magnetic layer differ from each other in facility of occurrence of magnetization reversal.

The spin valve type has a structure in which two magnetic layers are stacked one on the other with a non-magnetic layer interposed therebetween, as the minimum unit. The magnetization of one of the layers is fixated by a ferromagnetic layer or anti-ferromagnetic layer provided adjacent to that one of layers, and the magnetization of the other magnetic layer is rotated by an external magnetic field, thus creating a magnetization anti-parallel to the magnetic layers.

The magnetic layer 1 is formed of a ferromagnetic element such as Co, Fe, or Ni, or an alloy thereof. However, the ferromagnetic material for the magnetic layer 1 is not limited to a specific one as far as the ferromagnetic material exhibits a magnetoresistance effect. The magnetic layer 1 has a thickness $t_M$ falling within the range of $2\text{Å} \leq t_M \leq 100\text{Å}$, and more preferably $4\text{Å} \leq t_M \leq 80\text{Å}$.

The material for the nonmagnetic layer 3 is not limited to a specific one as far as the layer 3 is formed of a non-ferromagnetic material exhibiting a magnetoresistance effect. Examples of the material are an element (e.g., Cu, Cr, Au, Ag, or Ru) paramagnetic at room temperature, and an alloy containing these elements. The non-magnetic layer 3 has a thickness $t_N$ falling within the range of $2\text{Å} \leq t_N \leq 100\text{Å}$, and more preferably $9\text{Å} \leq t_N \leq 50\text{Å}$.

The mixture layer 2 is formed by mixing a ferromagnetic element and a non-ferromagnetic element. The ferromagnetic element is mixed to have a concentration gradient from the magnetic layer 1 to the non-magnetic layer 3 in units of atomic layers. This concentration gradient is preferably steep, and $2(X_1/X_n)/n$ is larger than 1.1 where $X_1$ is the atomic concentration (%) of the ferromagnetic element of an atomic layer closest to the magnetic layer 1 and $X_n$ is the atomic concentration (%) of the ferromagnetic element of an n-th atomic layer closest to the non-magnetic layer 3. More preferably, $2(X_1/X_n)/n$ is larger than 1.5. The concentration gradient depends on film formation conditions. For example, if an ion beam sputtering method is used, the concentration gradient depends on various conditions such as the relative distance between a substrate and a target in a film formation apparatus, the acceleration voltage, the initial degree of vacuum, the gas pressure, the film formation temperature, and the current value. In this case, $X_1$ is preferably larger than 60%, and $X_n$ is preferably smaller than 40%. The mixture layer 2 preferably has a thickness $t_X$ falling within the range of $1.2\text{Å} \leq t_X \leq 10\text{Å}$ to obtain a higher magnetoresistance ratio.

If the probability of magnetic atoms being concentrated around a given magnetic atom in the mixture layer is represented by equation (1):

$$P(X_1) = X_1 + \alpha_1(1 - X_1) \quad (1)$$

(where $X_1$ is the concentration of magnetic atoms of the i-th layer of the mixture layer, and $\alpha_1$ is an order parameter; the order parameter $\alpha_1$ represents the degree of localization in $-1 \leq \alpha_1 \leq 1$; if $\alpha_1 = 0$, a random atomic arrangement is formed; if $\alpha_1 < 0$, an order state is formed; and if $\alpha_1 > 0$, a cluster is formed), $\alpha_1$ in equation (1) preferably satisfies condition $-0.3 \leq \alpha_1 \leq 1.0$. More preferably $-0.3 \leq \alpha \leq 0.3$.

In forming a desired magnetoresistance effect element by sequentially stacking the above layers, the number of layers is not limited to a specific number, but can be arbitrarily determined. The number of unit layers is general up to 100.

The second embodiment of the present invention will be described below. A magnetoresistance effect element comprising a multilayer stack of alternating magnetic layers and at least one non-magnetic layer, said at least one magnetic layer containing a metal element or an alloy thereof wherein said metal element or alloy thereof is magnetically polarized in a non-ferromagnetic matrix metal material due to the presence of said magnetic layer, said multilayer exhibiting a magnetoresistance effect.

This structure is based on the finding of the present inventors that when an element such as Ni is added to partially substitute Cu of the non-magnetic layer, a negative exchange interaction acting between the ferromagnetic layer and the non-magnetic layer is reduced due to magnetic polarization (spin polarization) of the added element at the interface between the ferromagnetic layer and the non-magnetic layer, so that the saturation magnetic field is reduced, and the change $\Delta\rho$ in magnetoresistance is increased.

The magnetic layers and the at least one non-magnetic layer containing an element magnetically polarized due to the presence of the magnetic layer are alternately stacked to obtain a multilayer. With this structure, the saturation magnetic field can be minimized. At the same time, the change $\Delta\rho$ in magnetic resistance is increased.

Figure 2:
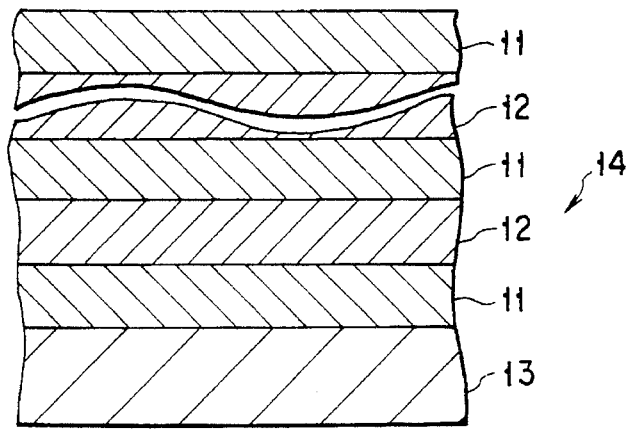
FIG. 2 is a sectional view showing the layered structure of a magnetoresistance effect element according to the second embodiment of the present invention.

FIG. 2 is a sectional view showing a magnetoresistance effect element according to the second embodiment of the present invention. This magnetoresistance effect element comprises a multilayer 14 obtained by alternately stacking magnetic layers 11 and non-magnetic layers 12 on a substrate 13.

It should suffice if the multilayer 14 includes at least three layers of a magnetic layer 21/a non-magnetic layer 22/a magnetic layer 21. Further, adjacent magnetic layers may or may not be anti-ferromagnetically coupled with each other as in the case of the first embodiment. Examples of the non-coupling type multilayer having no anti-ferromagnetic coupling between magnetic layers are the Shinjo type and the Spin valve type, as in the case of the first embodiment.

As in the first embodiment, the magnetic layer 11 is formed of a ferromagnetic element such as Co, Fe, or Ni, or an alloy thereof. However, the ferromagnetic material for the magnetic layer 11 is not limited to a specific one as far as the ferromagnetic material exhibits a magnetoresistance effect.

The non-magnetic layer 12 exhibits paramagnetic properties at room temperature as a single layer containing a metal element or an alloy thereof magnetically polarized due to the presence of the magnetic layer in the matrix metal of the non-ferromagnetic material. Examples of such an additive are a ferromagnetic element, an element such as Pt or Pd which is easily magnetically polarized, and alloys thereof. The additive is preferably formed of at least one of Ni, Mn, Pt, Pd, Rh, Co, and Fe, and an alloy thereof. The matrix metal of this layer may be a non-ferromagnetic element such as Mo, Nb, or Al and a non-ferromagnetic alloy, and preferably a noble metal element such as Cu, Au, or Ag.

The additive can be contained in the range capable of causing the layer to maintain paramagnetic properties as a single layer at room temperature and causing the additive to dissolve in the matrix metal. The content of the additive varies depending on the matrix metal and additive elements, and is 25 atm % or less for Cu-Mn, 43 atm % or less for Cu-Ni, and 100 atm % or less for Cu-Pt and Cu-Pd. If the content of the additive in the non-magnetic layer is less than 2 atm %, the effect of the additive is small. However, if the content exceeds 20 atm %, it is difficult to obtain anti-parallel magnetic coupling between the magnetic layers. As a result, a high magnetoresistance ratio cannot be obtained.

The thickness of each layer is determined in favor of obtaining a higher magnetoresistance ratio. The magnetic layer 11 preferably has a thickness of 2Å to 100Å and more preferably 5Å or more. The non-magnetic layer 12 preferably has a thickness of 2Å to 100Å, more preferably 5Å or more, and further 8 to 80Å. The number of layers is not limited to a specific number, but can be arbitrarily determined. The number of unit layers is generally up to 100.

The third embodiment of the present invention will be described below. A magnetoresistance effect element comprising a multilayer stack of alternating magnetic layers and at least one first non-magnetic layer, and having second non-magnetic layers interposed between adjacent magnetic and first non-magnetic layers, wherein said second non-magnetic layers contain a metal element or an alloy thereof wherein said metal element or alloy thereof is magnetically polarized in a non-ferromagnetic matrix metal material due to the presence of said magnetic layer, said multilayer exhibiting a magnetoresistance effect.

The present inventors have made extensive studies on artificial lattice films exhibiting a magnetoresistance effect. It is found that if a CuNi alloy obtained by partially substituting Cu of the non-magnetic layer with Ni is formed between a ferromagnetic layer and a non-magnetic layer, a larger change ($\Delta\rho=\rho_0-\rho_n$) in magnetoresistance than that of Co/Cu is obtained. On the other hand, it is apparent from the magnetization measurement of this artificial lattice film that Ni in CuNi is polarized. This indicates that Ni in CuNi near the interface contacting Co is polarized, the magnetic randomness at the interface between the magnetic atomic plane and the non-magnetic atomic plane is substantially increased, and scattering depending on an electron spin is enhanced. As a result, a magnetoresistance ratio is increased. This means that if non-magnetic layers containing a substance magnetically polarized therein are inserted at the interfaces between the magnetic and the non-magnetic layers, a magnetic interface structure can be artificially controlled. The structure of the third embodiment is based on this finding. The magnetic randomness at the interface is thus controlled to obtain a large magnetoresistance effect.

Figure 3:
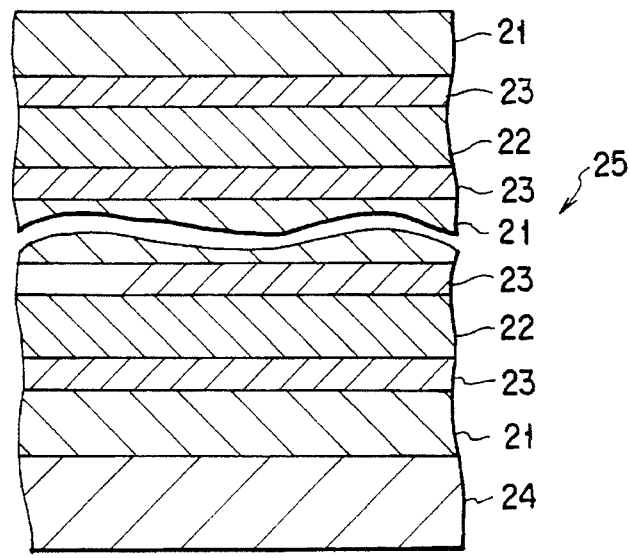
FIG. 3 is a sectional view showing the layered structure of a magnetoresistance effect element according to the third embodiment of the present invention.

FIG. 3 is a sectional view showing a magnetoresistance effect element according to the third embodiment of the present invention. This magnetoresistance effect element comprises a multilayer 25 in which a magnetic layer 21, a first non-magnetic layer 22, and a second non-magnetic layer 23 formed between the magnetic layer 21 and the first nonmagnetic layer 22 are repeatedly formed on a substrate 24.

It should suffice if the multilayer 25 includes at least five layers of a magnetic layer 21/a second non-magnetic layer 23/a first non-magnetic layer 22/a second non-magnetic layer 23/a magnetic layer 21. Further, adjacent magnetic layers may or may not be anti-ferromagnetically coupled with each other as in the case of the first or second embodiment. Examples of the non-coupling type multilayer having no anti-ferromagnetic coupling between magnetic layers are the Shinjo type and the Spin valve type, as in the case of the first or second embodiment.

As in the first and second embodiments, the magnetic layer 21 is formed of a ferromagnetic element such as Co, Fe, or Ni, or an alloy thereof. However, the ferromagnetic material for the magnetic layer 11 is not limited to a specific one as far as the ferromagnetic material exhibits a magnetoresistance effect.

The material for the first non-magnetic layer 22 is not limited to a specific one as far as the layer 22 is formed of a non-ferromagnetic material exhibiting a magnetoresistance effect. Examples of the material are Mo, Nb, and Al, and preferably a noble metal element such as Cu, Au, or Ag.

The non-magnetic layer 23 is substantially identical to the non-magnetic layer 12 of the second embodiment and exhibits paramagnetic properties at room temperature as a single layer containing a metal element or an alloy thereof magnetically polarized due to the presence of the magnetic layer in the matrix metal of the non-ferromagnetic material. Examples of such an additive are a ferromagnetic element, an element such as Pt or Pd which is easily magnetically polarized, and alloys thereof. The additive is preferably formed of at least one of Ni, Mn, Pt, Pd, Rh, Co, and Fe, and an alloy thereof. The matrix metal of this layer may be a non-ferromagnetic element such as Mo, Nb, or Al and a non-ferromagnetic alloy, and preferably a noble metal element such as Cu, Au, or Ag. Particularly, the same material as that constituting the first non-magnetic layer 22 is preferable.

The additive can be contained in the range capable of causing the layer to maintain paramagnetic properties as a single layer at room temperature and causing the additive to dissolve in the matrix metal. The content of the additive varies depending on the matrix metal and additive elements, and may be 50 atm % or less as far as the paramagnetic properties are maintained.

The thickness of each layer is determined in favor of obtaining a higher rate of change in magnetic resistance. The magnetic layer 21 preferably has a thickness of 4Å to 100Å, more preferably 50Å or less, and further 10Å to 50Å. The non-magnetic layer 22 preferably has a thickness of 5Å to 80Å, more preferably 50Å or less. The second non-magnetic layer 23 preferably has a thickness of 1Å to 5Å. The number of layers is not limited to a specific number, but can be arbitrarily determined. The number of unit layers is generally up to 100.

In each embodiment described above, each layer is formed by ion beam sputtering, RF sputtering, or molecular beam epitaxy. Any substrate can be used if a layer can be formed thereon by such a method.

In any embodiments described above, it is preferable to form a bias applying layer which is applying bias magnetic field to a multilayer on the multilayer.

FIG. 25 shows a magnetoresistance effect elements in which a bias applying layer 41 is formed on the multilayer 5 or 14 or 25. Not that, a reference numeral 42 denotes a conductive layer.

The material for the bias applying layer 41 is not limited to a specific one as far as the layer 41 can apply proper bias magnetic field to the multilayer. Examples of the material of bias applying layer 41 are a ferromagnetic body which is magnetized, FeMn alloy and TbCo alloy and the like.

EXAMPLES

The present invention will be described in detail by way of its examples.

EXAMPLE 1

To clarify the theory of the first embodiment of the present invention, an analysis was performed by computer simulation. In this analysis, an Fe/Cr system having an Fe magnetic layer, a Cr non-magnetic layer, a mixture layer containing Fe as the ferromagnetic element and Cr as the non-ferromagnetic element, and a Co/Cr system having a Co ferromagnetic layer, a Cr non-magnetic layer, and a mixture layer containing Co as the ferromagnetic element and Cr as the non-ferromagnetic element were examined.

Figure 4:
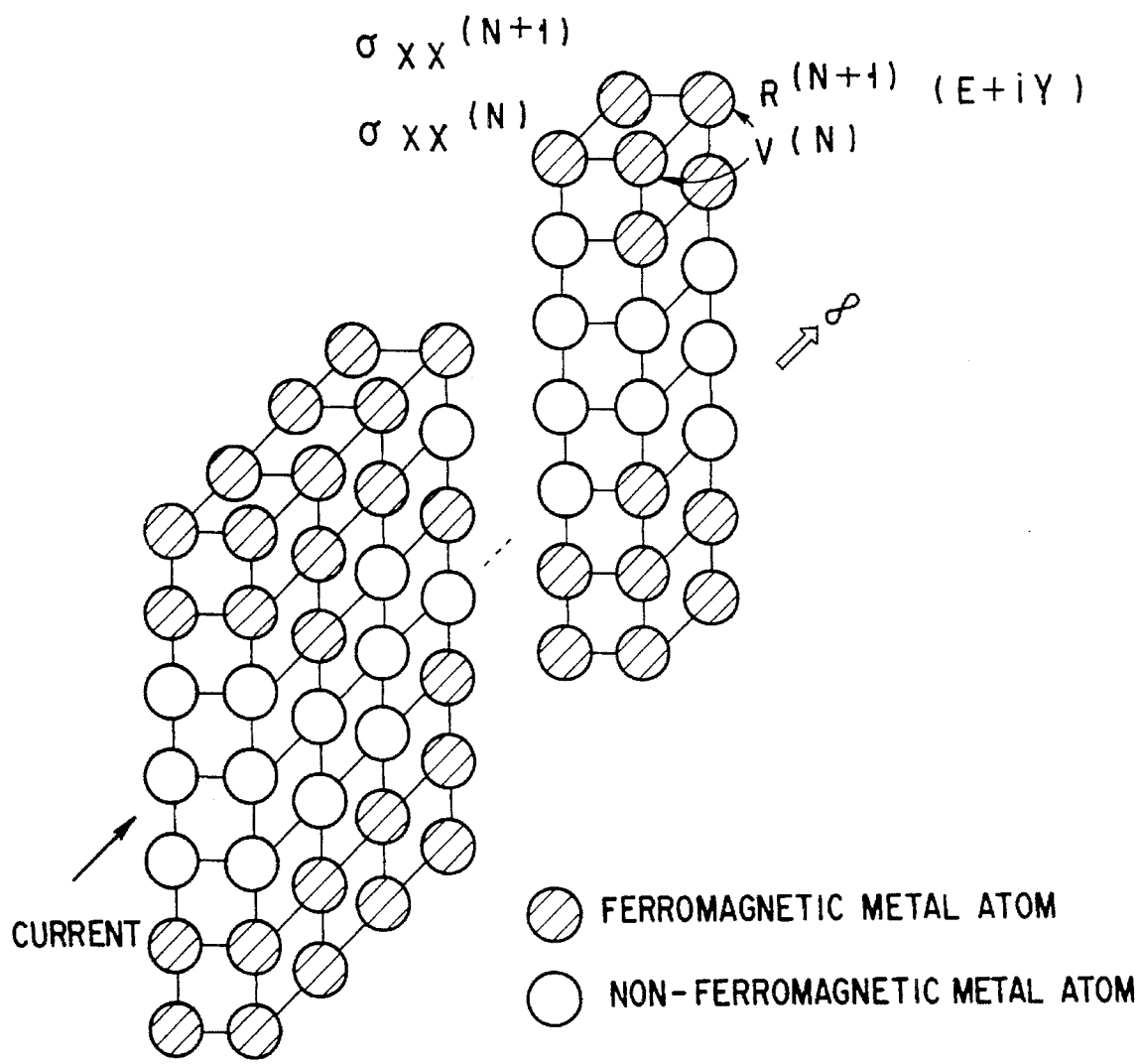
FIG. 4 is a view showing a calculation model and a calculation method for computer-simulating the first embodiment of the present invention.

FIG. 4 shows a calculation model and a calculation method to computer-simulate the first embodiment of the present invention. This model is suitable to easily examine the influence of a mixture layer on the magnetoresistance effect in a magnetic artificial lattice film.

The model was defined to have a sandwich film structure in which each of upper and lower magnetic layers has a thickness corresponding to two atoms, a non-magnetic layer serving as an intermediate layer had a thickness corresponding to three atoms, each of mixture layers as bonding layers between the upper magnetic layer and the non-magnetic layer and between the lower magnetic layer and the non-magnetic layer had a thickness corresponding to two atoms. The model was defined to have a width corresponding to two atoms and an infinite length. The crystal structure was defined to be a simple cubic lattice.

Of the mixture layers, the concentration of the ferromagnetic atoms of an atomic layer closest to the magnetic layer is defined as (100−p)%, the concentration of the ferromagnetic atoms of an atomic layer closest to the non-magnetic layer is defined as p%, and atomic mixing is defined as random.

The calculation method is based on a conduction theory convenient in the calculation of an electric conductivity of a thin film structure (J. Phys. C: Solid St. Phys., Vol. 13. pL1031 (1980), Z. Phys. B-Condensed Matter, Vol. 59, p. 385 (1985)). According to this theory, in an artificial lattice film having an x-direction length corresponding to (N+1) atoms, an electric conductivity $\rho XX^{(N+1)}$ upon application of an electric field in the x direction is given by an electric conductivity $\rho XX^{(N)}$ for a length corresponding to (N) atoms, a matrix element $R^{(N+1)}(E+i\text{Å})$ of the Green function associated with the (N+1)th slice face, and an electron transfer matrix $v^{(N)}$ between the (N)th and the (N+1)th slice faces. In this case, E+iγ is a complex number, E is the conduction electron energy, and γ is the energy representing the blurring width of an electronic state which is caused by bulk scattering such as the lattice vibration, impurity, lattice defect, and lattice mismatching of the artificial lattice film system. In this case, γ is called a bulk scattering factor.

$R^{(N+1)}(E+i\gamma)$ contains information of atomic mixing and a potential field felt by ↑/↓ spin electrons when the magnetic moments of the ferromagnetic layer are aligned parallel to each other (ferromagnetic arrangement) or anti-parallel to each other (anti-ferromagnetic arrangement).

In the computer simulation, electron energy band calculation results (1991, J. Phys. Soc. Jpn., Vol. 60, p. 376) are used for the potential values of the ↑/↓ spin electrons at Fe and Cr atomic positions and the potential values of the ↑/↓ spin electrons at the Co and Cr atomic positions.

In the ferromagnetic arrangement, judging from the above band calculation results, a potential difference of the ↑ spin electrons between the ferromagnetic atomic position and the non-ferromagnetic atomic position is much larger than the potential difference of the ↓ spin electrons. Characteristically, the ↓ spin electrons have a zero potential difference in the Fe/Cr system, while the ↓ spin electrons have a small potential difference in the Co/Cr system. In the anti-ferromagnetic arrangement, the ↑ (or ↓) spin electrons receive a potential field in which a half of the potential applied to the ↑ spin electrons and a half of the ↓ spin electrons in the ferromagnetic arrangement are coupled to each other.

Using the above conduction theory, the electric conductivities of the ↑/↓ spin electrons in the ferromagnetic arrangement and the anti-ferromagnetic arrangement are numerically calculated at p=0%, 10%, 20%, 30%, 40%, 50%, 60%, 70%, 80%, 90%, and 100%. The electric resistivities $\rho^F\uparrow(\downarrow)$ and $\rho^{AF}\uparrow(\downarrow)$ are further obtained from the above calculated values. In addition, ρF and ρAF are obtained from the following equations:

$$1/\rho^F = 1/\rho^F\uparrow + 1/\rho^F\downarrow$$

$$1/\rho^{AF} = 1/\rho^{AF}\uparrow + \rho^{AF}\downarrow = \rho^{AF}\uparrow$$

The magnetoresistance ratio of the magnetic artificial lattice film is obtained as:

$$MR = (\rho^{AF} - \rho^F)/\rho^F$$

Figure 5A:
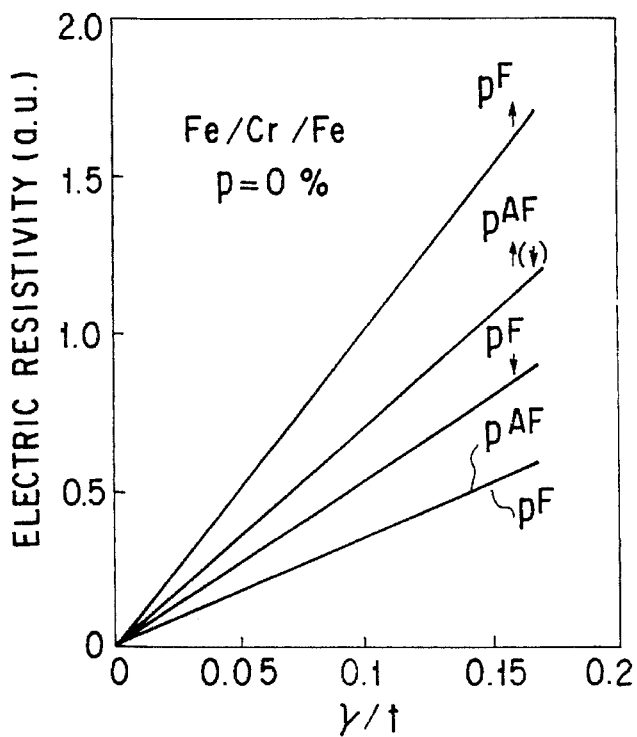
FIGS. 5A and 5B are graphs showing the relationship between the electric resistivities and bulk scattering factors in Fe/Cr systems as examples of the computer simulation in FIG. 4.
Figure 5B:
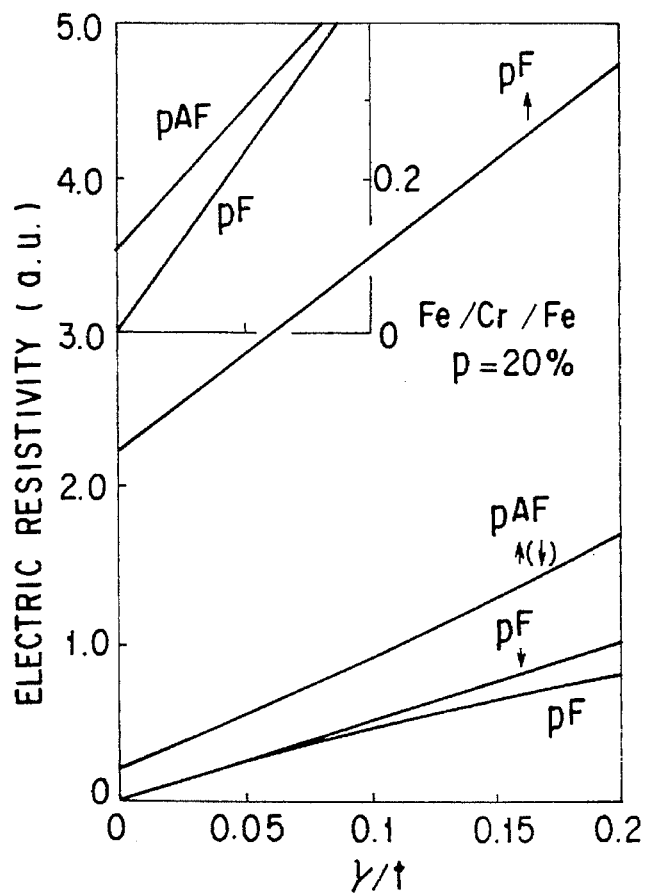
Figure 11:
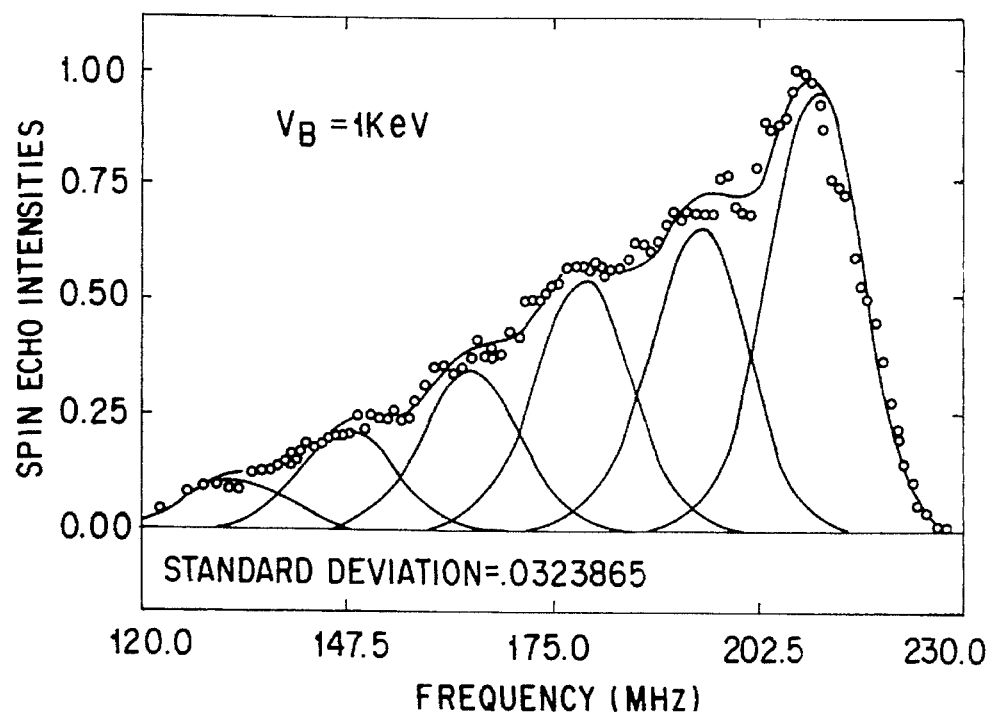
FIG. 11 is a graph showing the frequency dependency of the $^{59}$Co nuclear spin echo intensity of a multilayered film c in Example 2.
Figure 12:
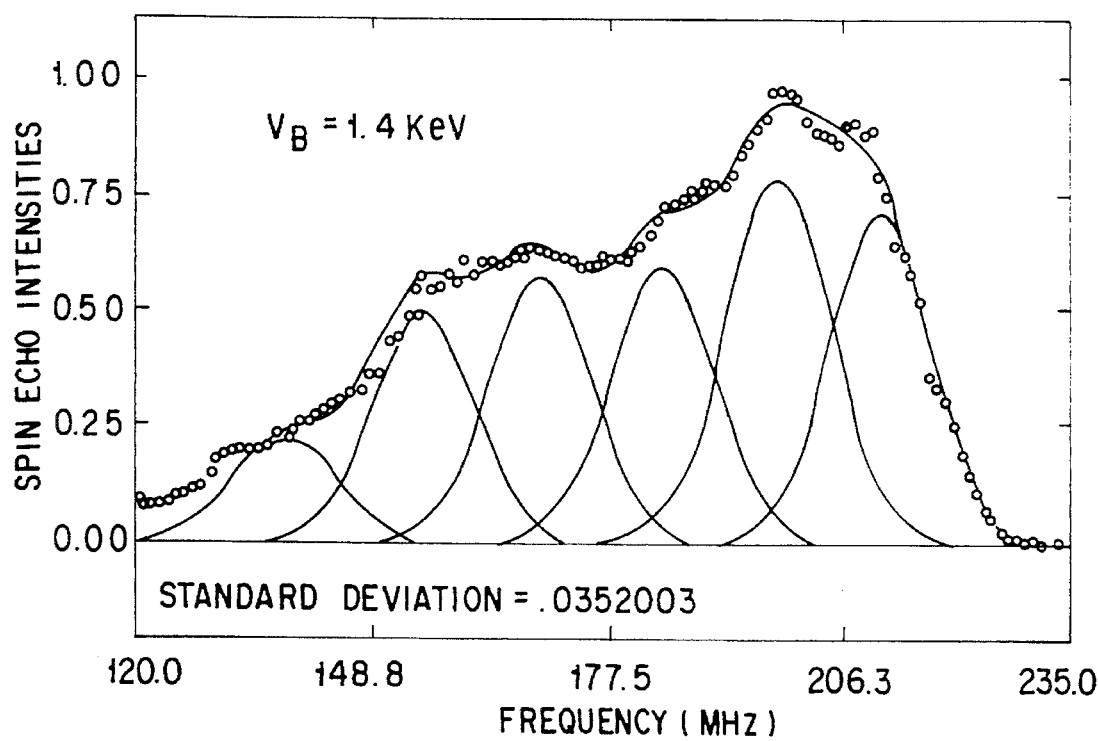
FIG. 12 is a graph showing the frequency dependency of the $^{59}$Co nuclear spin echo intensity of a multilayered film d in Example 2.
Figure 13A:
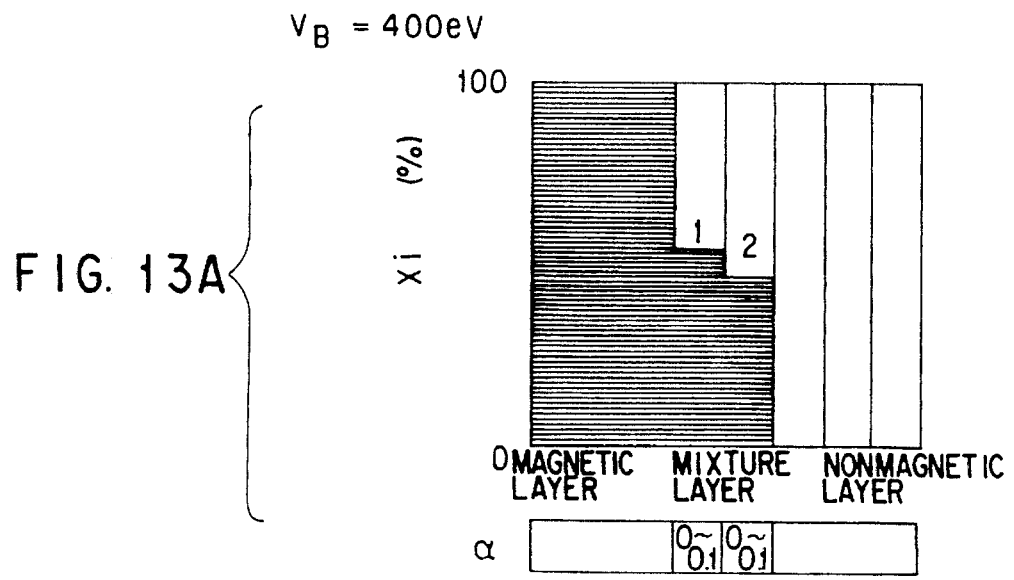
FIGS. 13A to 16B are views showing the concentration distributions of magnetic atoms of the multilayered films a to d in Example 2.
Figure 13B:
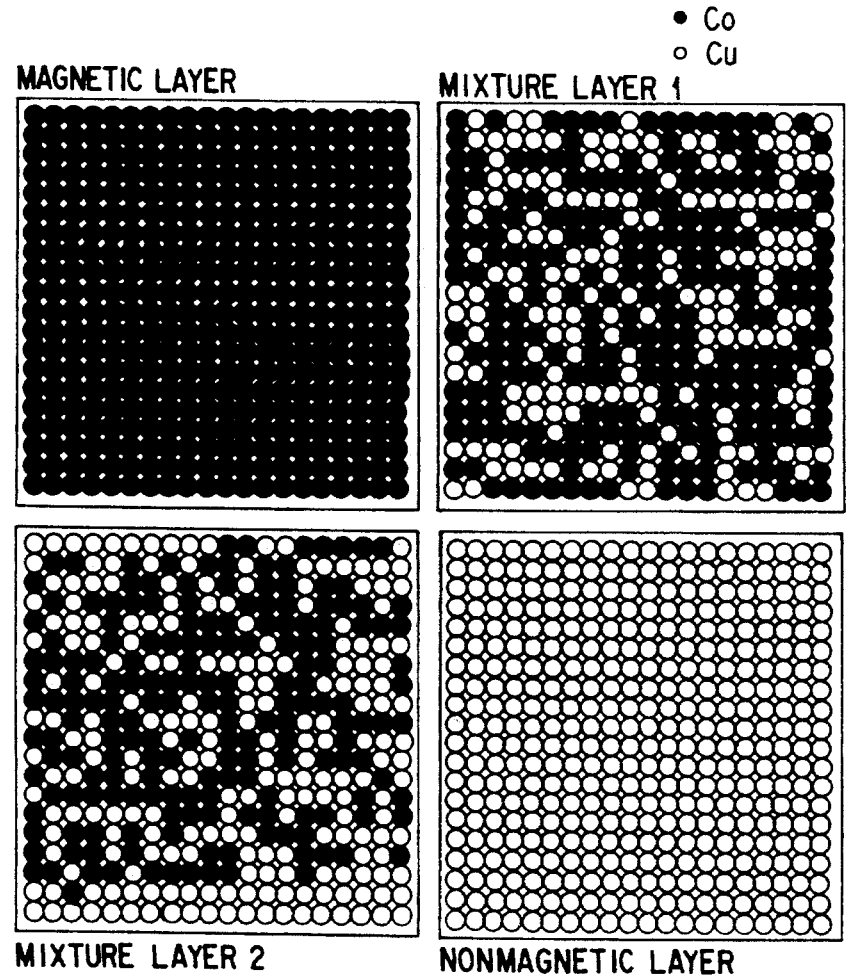
Figure 14A:
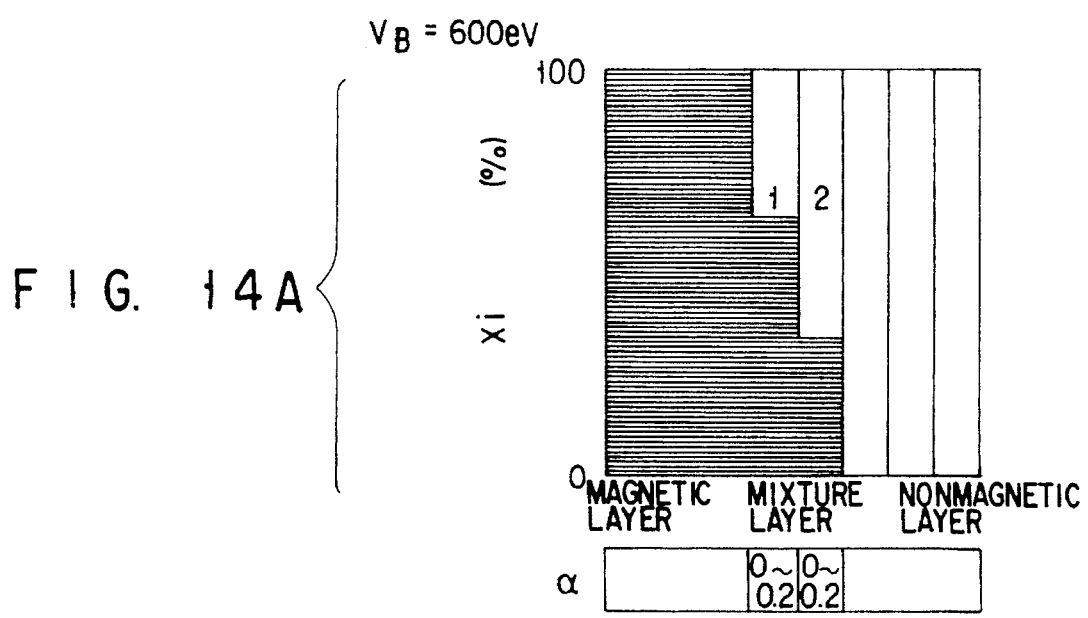
Figure 14B:
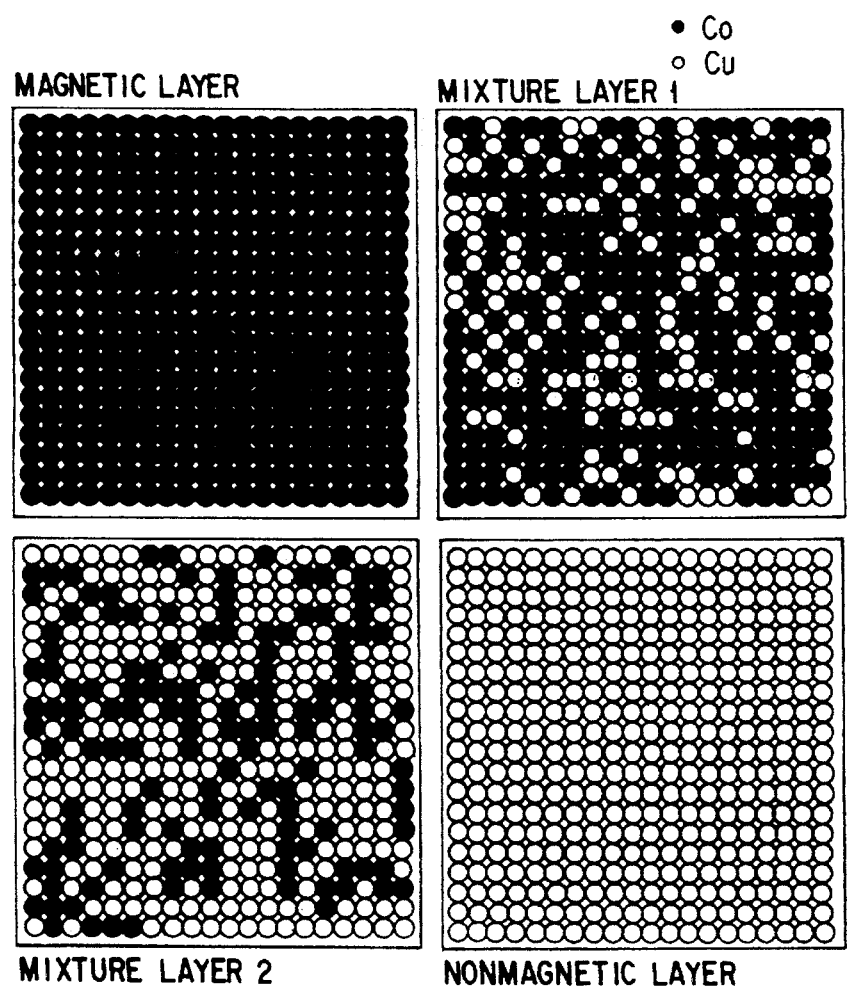
Figure 15A:
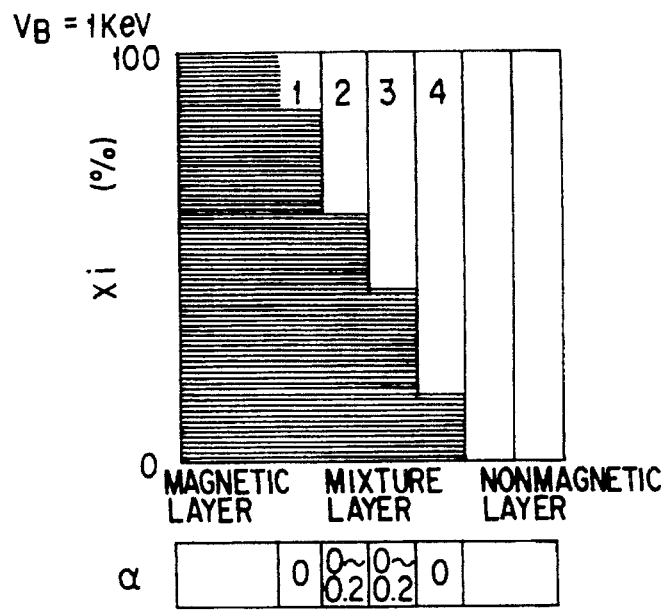
Figure 15B:
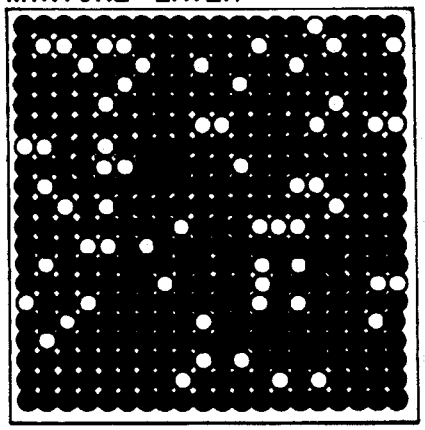
Figure 15B:
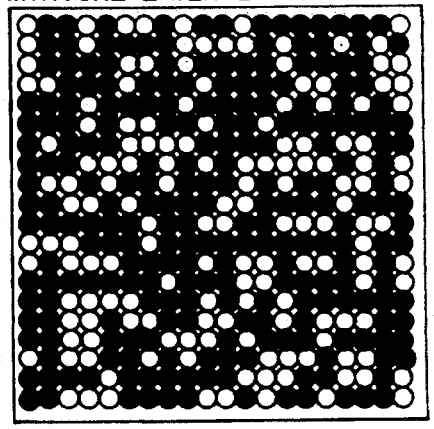
Figure 15B:
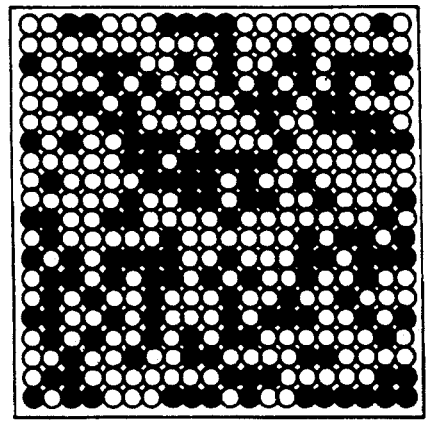
Figure 15B:
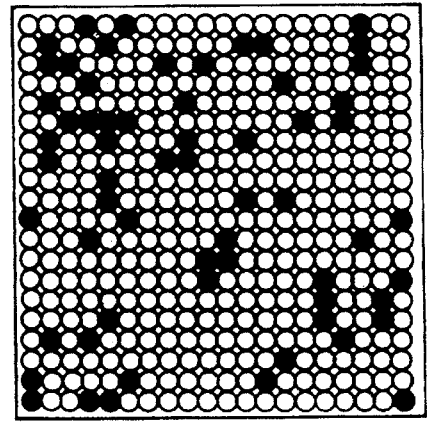
Figure 16A:
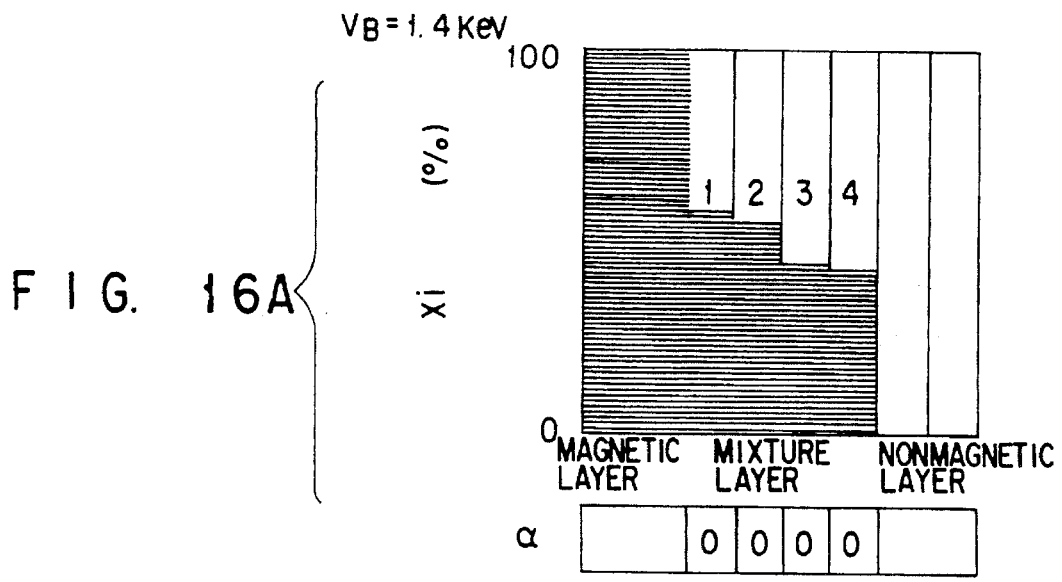
Figure 16B:
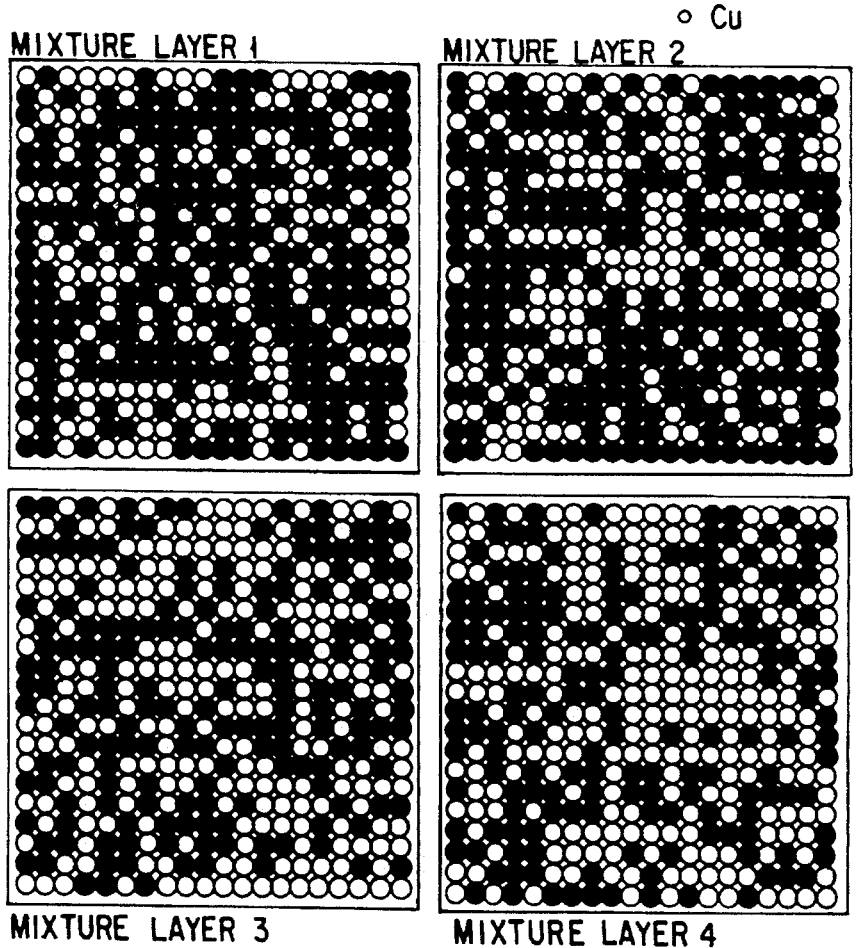
Figure 17:
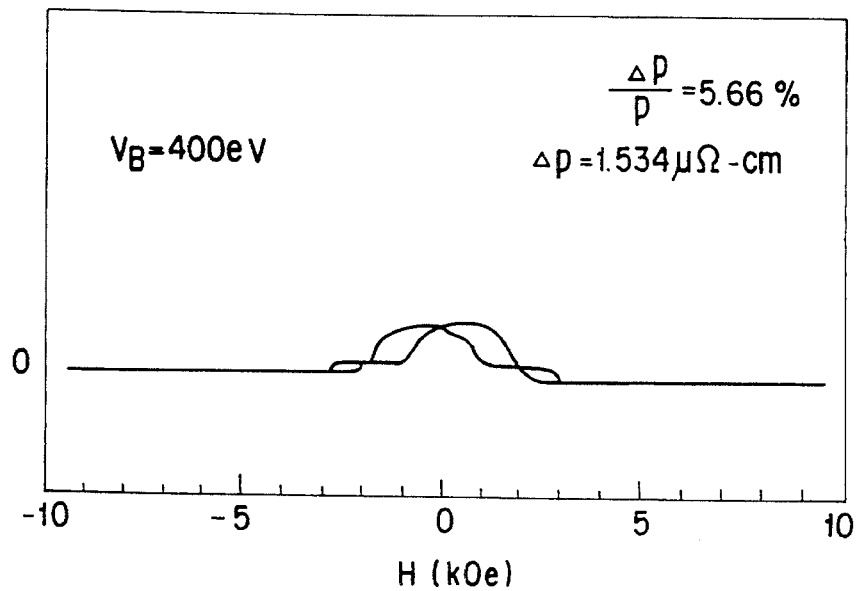
FIG. 17 is a graph showing the magnetoresistance ratio as a function of the magnetic field of the multilayered film a in Example 2.
Figure 18:
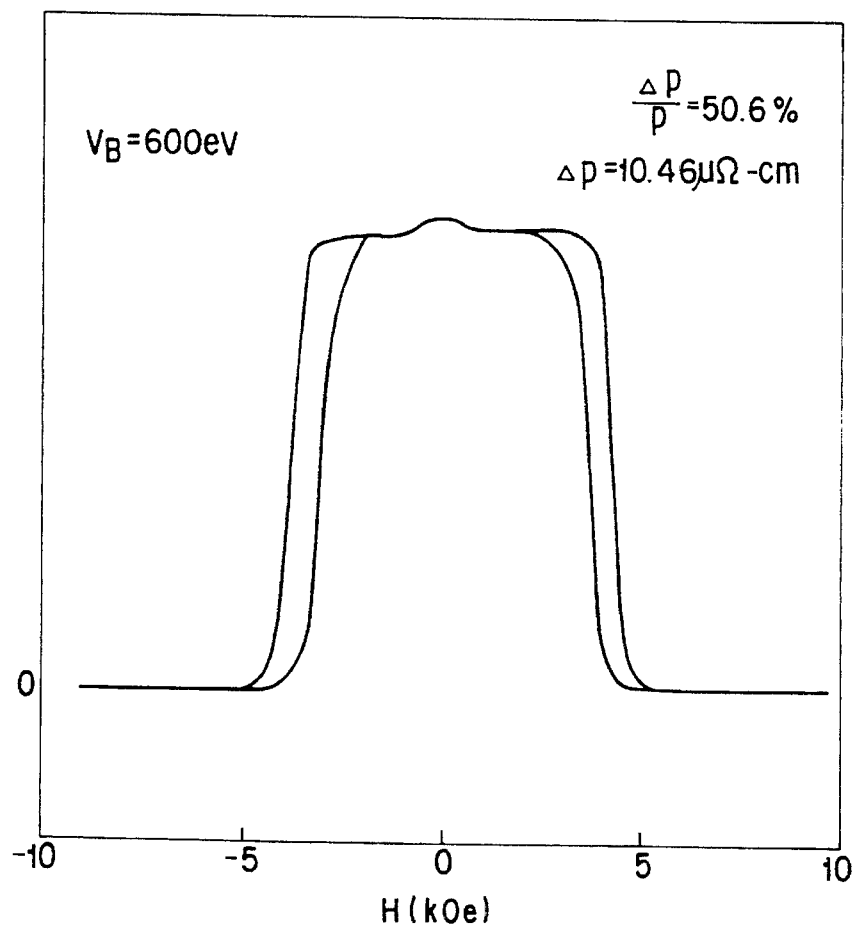
FIG. 18 is a graph showing the magnetoresistance ratio as a function of the magnetic field of the multilayered film b in Example 2.
Figure 19:
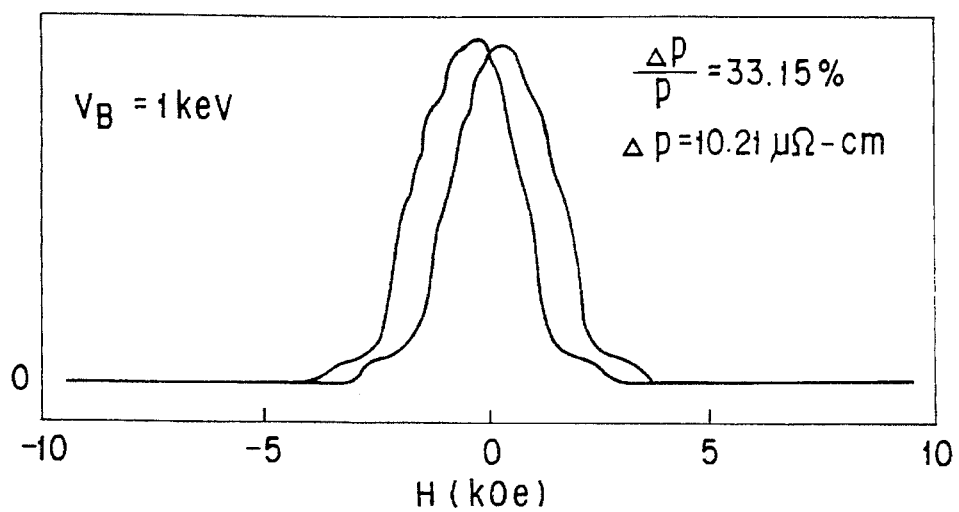
FIG. 19 is a graph showing the magnetoresistance ratio as a function of the magnetic field of the multilayered film c in Example 2.
Figure 20:
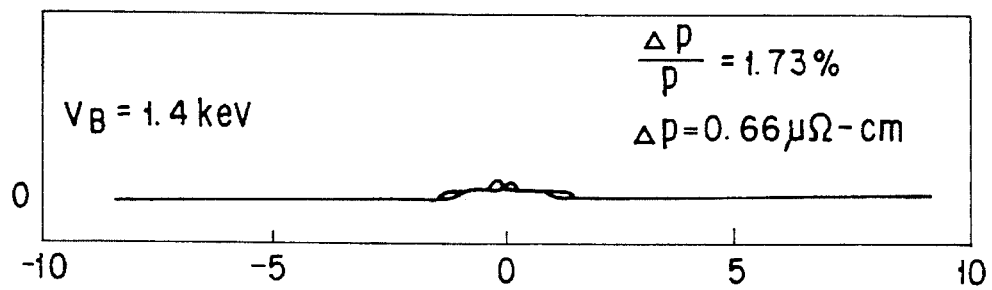
FIG. 20 is a graph showing the magnetoresistance ratio as a function of the magnetic field of the multilayered film d in Example 2.

As calculation samples, FIGS. 5A and 5B show the relationships between the various electric resistivities and the bulk scattering factors γ/t in the Fe/Cr systems of p=0% and 20%, and FIGS. 6A and 6B show the relationships between the various electric resistivities and the bulk scattering factors γ/t in the Co/Cr systems of p=0% and 20%. In this case, t is the electron transfer energy between the adjacent atoms. The calculation results of $\rho^{AF}$ and $\rho^F$ for p=20% do not have much difference and are illustrated in an enlarged scale.

If bulk scattering and scattering caused by the mixture layers are absent in a thin film multilayered structure having an infinite length, the momentum of electrons in the longitudinal direction of the film must be conserved, and the electric resistance must be zero. The results of FIGS. 5A and 6A for p=0 indicate this as the numerical calculation results.

Mixing between ferromagnetic atoms and non-ferromagnetic atoms occurs in each mixture layer at a certain probability, and potentials are exchanged. Therefore, in general, a residual resistance caused by scattering in the mixture layer occurs. The ↓ spin electrons of the Fe/Cr system do not feel the potential disturbance in the mixture layer because the potential levels at the Fe and Cr atomic positions are equal to each other. Therefore, no residual resistance caused by scattering of the ↓ spin electrons in the mixture layer occurs.

On the other hand, a residual resistance occurs due to scattering in the mixture layer because the ↓ spin electrons of the Co/Cr system have a small potential difference.

FIGS. 7 and 8 show the relationships between p and MR (magnetoresistance ratio) when the γ/t values are used as parameters in the Fe/Cr and Co/Cr systems, respectively. This is the simulation of the influence of the mixture layer on the MR value. When the p value increases from 0%, the MR value generally tends to increase accordingly. However, when the p value increases further toward 100%, the MR value decreases again.

That is, an optimal atomic mixing probability of the mixture layer for the magnetoresistance effect of the magnetic artificial lattice film is present. An optimal p value is 30% to 40% for both the Fe/Cr and Co/Cr systems.

An experimental MR value is 82% at a measurement temperature of 4.2K and 18% at room temperature in the Fe/Cr system (Phys. Rev. Lett., Vol. 61, p. 2472 (1988)), and 2.5% (temperature: unknown) in the Co/Cr system (Phys. Rev. Lett. Vol., p. 2304 (1990)).

The main origin of γ is assumed to be a lattice vibration. Therefore, when the temperature increases, the γ value increases with an increase in temperature. The calculation results of the Fe/Cr system fully explain the magnitude and the temperature tendency as compared with the experimental results. A smaller MR value is obtained for the Co/Cr system than that for the Fe/Cr system in both the experimental and calculation results.

Judging from the results of FIGS. 7 and 8, the concentration distribution of the ferromagnetic atoms in the mixture layer have a correlation with the MR value. It is confirmed that if the concentration of the ferromagnetic atoms of the atomic layer closest to the magnetic layer is set to 60% to 70% and the concentration of the magnetic atoms of the atomic layer closest to the non-magnetic layer is given as 30% to 40%, a large MR value can be apparently obtained.

Fe/Cr- and Co/Cr-system multilayer samples were actually manufactured on the basis of this model and were subjected to an experiment. The same result as in the simulation model was obtained.

This relationship did not depend on the type of atoms of the non-magnetic layer but could equally be obtained if Cu, Ag, or Au was used for the non-magnetic layer.

EXAMPLE 2

A magnetoresistance effect element based on the first embodiment was manufactured using Co magnetic layers, Cu non-magnetic layers, and mixture layers containing Co as a ferromagnetic element and Cu as a non-ferromagnetic element.

After the relative positions of MgO (110) substrate and Co and Cu targets were set in an ion beam sputtering apparatus, the chamber was evacuated to a degree of vacuum of $5\times10^{-7}$ Torr. An Ar gas was supplied to an ion gun until the partial pressure reached $1.3\times10^{-4}$ Torr. The Ar gas was ionized to perform sputtering at a target current of 30 mA while the acceleration voltage was changed in an order of 400 eV, 600 eV, 1 keV, and 1.4 keV.

The energies of the atoms alternately sputtered from the two targets were changed by the acceleration voltages, and four multilayers a b, c, and d corresponding to the acceleration voltages ($V_B$) of 400 eV, 600 eV, 1 keV, and 1.4 keV and having different concentration gradients of the mixture layers in units of atomic layers were obtained. 100 20Å thick sets of magnetic layer/mixture layer/non-magnetic layer were obtained. The orientation plane of the resultant film was (110).

The concentration distributions of the magnetic elements in the mixture layers of the four different multilayers were measured by NMR. An NMR apparatus used was a standard pulse NMR spectrometer. The measurement temperature was 4.2K. A coil was directly wound around each sample and was fixed with a Teflon tape. A spin echo signal was observed to obtain its frequency spectrum. To accurately measure the spin echo signal intensity, spin-spin relaxation was measured to correct the signal intensity.

FIGS. 9 to 12 show frequency dependencies of the $^{59}$Co nuclear spin echo intensities of the samples a to d, respectively. The spin echo intensity is corrected by the square of the frequency.

As can be apparent from FIGS. 9 to 12, when the acceleration voltage was increased, it was found that the signal intensity in a low-frequency range increased. Solid lines represent the measurement results of six Gaussian spin echo spectra in accordance with the method of least squares (in this case, the Gaussian widths of the six spin echo spectra were set equal to each other).

An fcc structure has 12 most proximity atoms. The six Gaussian lines correspond to a site where Co is surrounded by 12 Co atoms, a site where Co is surrounded by 11 Co atoms and one Cu atom, a site where Co is surrounded by 10 Co atoms and two Cu atoms, a site where Co is surrounded by nine Co atoms and three Cu atoms, a site where Co is surrounded by eight Co atoms and four Cu atoms, and a site where Co is surrounded by seven Co atoms and five Cu atoms in a frequency descending order. The intensity ratio corresponds to a ratio of the number of sites. This intensity ratio must be accurately corrected with $T_2$ (spin-spin relaxation). The $T_2$ values were obtained as 29 μsec, 32 μsec, 33 μsec, 34 μsec, 37 μsec, and 39 μsec in the frequency descending order. The ratios of the number of sites obtained from the above measurement results are shown in Tables 1 to 4 below.

TABLE 1

| Acceleration Voltage 400 V | | |
|---|---|---|
| Frequency (MHz) | Internal Magnetic Field (T) | Ratio of the number of sites |
| 209.275 | 20.815 | 1.0 |
| 193.945 | 19.29 | 0.398803 |
| 178.54 | 17.758 | 0.30847 |
| 164.72 | 16.383 | 0.331769 |
| 149.81 | 14.901 | 0.072254 |
| 134.076 | 13.336 | 0.063109 |

TABLE 2

| Acceleration Voltage 600 V | | |
|---|---|---|
| Frequency (MHz) | Internal Magnetic Field (T) | Ratio of the number of sites |
| 209.705 | 20.8579 | 1.0 |
| 193.83 | 19.2789 | 0.370056 |
| 181.445 | 18.047 | 0.2670337 |
| 168.66 | 16.775 | 0.235143 |
| 153.594 | 15.277 | 0.1228295 |
| 137.832 | 13.709 | 0.0528538 |

TABLE 3

| Acceleration Voltage 1 kV | | |
|---|---|---|
| Frequency (MHz) | Internal Magnetic Field (T) | Ratio of the number of sites |
| 209.995 | 20.8867 | 1.0 |
| 194.316 | 19.327 | 0.6436237 |
| 178.873 | 17.791 | 0.5128211 |
| 163.886 | 16.301 | 0.32843399 |
| 148.144 | 14.735 | 0.1964016 |
| 132.594 | 13.188 | 0.0939862 |

TABLE 4

| Acceleration Voltage 1.4 kV | | |
|---|---|---|
| Frequency (MHz) | Internal Magnetic Field (T) | Ratio of the number of sites |
| 211.27 | 21.0135 | 1.0 |
| 198.36 | 19.7295 | 1.04816 |
| 184.275 | 18.3285 | 0.7817644 |
| 169.069 | 16.816 | 0.74170599 |
| 154.715 | 15.388 | 0.631098 |
| 138.248 | 13.7505 | 0.2815887 |

It is apparent from Tables 1 to 4 that the resonance frequencies are distributed almost every 15 MHz. The concentration distributions of magnetic atoms of the mixture layers were measured from the resultant internal magnetic field distributions.

In this case, important physical quantities defining an internal magnetic field distribution are the concentration distribution of magnetic atoms of each atomic layer of the mixture layer and a shortest distance order of atoms in the mixture layer. If the concentration of the magnetic atoms in the i-th atomic layer from the atomic layer adjacent to the ferromagnetic layer is defined as Xi, a probability P(Xi) of the presence of magnetic atoms in the most proximity site of the magnetic atoms is given by equation (2) below:

$$P(xi) = Xi + \alpha_i(1 - Xi) \quad (2)$$

In the mixture layer, atoms having different magnetic moments are present around the specified atom, and the contribution of the internal magnetic field from these magnetic moments is present. In this case, an internal magnetic field $H_{hf}$ is represented by equation (3) below:

$$H_{hf} = a\mu_{self} + b\Sigma\mu_{n1} \quad (3)$$

In this case, the first term represents the contribution from the magnetic moment $\mu_{self}$ of the specified itself, and the second term represents the contribution from the neighboring atoms and is generally proportional to the sum of magnetic moments of the most proximity atomic site.

The concentration distribution of magnetic atoms in the mixture layer corresponding to each acceleration voltage was measured using equation (3) in consideration of the two parameters in equation (2). The results are shown in FIGS. 13A to 16B. FIGS. 13A, 14A, 15A, and 16A are views for explaining the concentration Xi of magnetic atoms of each atomic layer and an α value, and FIGS. 13B, 14B, 15B, and 16B are views for explaining atomic arrangements of each atomic layer. The α value in the mixture layer of each multilayer satisfies condition $-0.3 \leq \alpha_1 \leq 0.3$. In the samples b and c corresponding to the acceleration voltages of 600 eV and 1 keV, $2(X_1/X_n)/n$, i.e., the ratio of the concentration $X_1$ (%) of magnetic atoms of the atomic layer closest to the Co layer to the concentration $X_n$ (%) of magnetic atoms of the n-th atomic layer closest to the Cu layer, is larger than 1.1. At the same time, $X_1 > 60\%$ or $X_n < 40\%$. That is, the concentration gradient for each atomic layer in the mixture layer is steep.

On the other hand, the magnetoresistance effects, along the axis of easy magnetization, of the multilayered film samples a to d having the mixture layers whose states have been analyzed as described above are shown in FIGS. 17 to 20.

As is apparent from FIGS. 17 to 20, the magnetoresistance ratios (MR value: $\Delta\rho/\rho$) of the samples a and d corresponding to the acceleration voltages of 400 eV and 1.4 keV are as low as several %. However, the MR values of the samples b and c corresponding to the acceleration voltages of 600 eV and 1 keV are as large as several 10% or more.

Judging from the above result, the concentration distribution of magnetic atoms of the mixture layer has a correlation with the MR value. When the concentration gradient of the mixture layer is steep, a large MR value is apparently obtained.

This correlation did not depend on the type of atoms of the nonmagnetic layer, but could be equally obtained with CuAu, Au or Ag.

EXAMPLE 3

A magnetoresistance effect element according to the second embodiment was manufactured using Co magnetic layers and a non-magnetic layers containing a Cu matrix metal and an Ni additive thereto.

An artificial lattice film of Co and $Cu_{1-x}Ni_x$ was formed on a substrate using an ion beam sputtering apparatus. A chamber was evacuated to a degree of vacuum of $2 \times 10^{-7}$ Torr, and an Ar gas was supplied to the ion gun until the partial pressure reached $1 \times 10^{-4}$ Torr. The Ar gas was ionized and was radiated on targets at an acceleration voltage of 700 eV. The targets were Co and $Cu_{1-x}Ni_x$ targets. These targets were alternately rotated every predetermined period of time to obtain artificial lattice films having Co layers and $Cu_{1-x}Ni_x$ layers, the thicknesses of which were changed. In this case, $Cu_{0.9}Ni_{0.1}$ and $Cu_{0.7}Ni_{0.3}$ layers were used. The substrate was an MgO (110) substrate, and the substrate temperature was room temperature.

To express the film structure, the thicknesses of a Co film and a $Cu_{1-x}Ni_x$ are defined as $t_{Co}$ and $t_{Cu}$, and a repetition times of pairs each consisting of the Co and $Cu_{1-x}Ni_x$ layers is defined as n, so that this artificial lattice film is expressed as $(Co t_{Co}/Cu_{1-x}Ni_x t_{Cu})_n$.

Figure 21A:
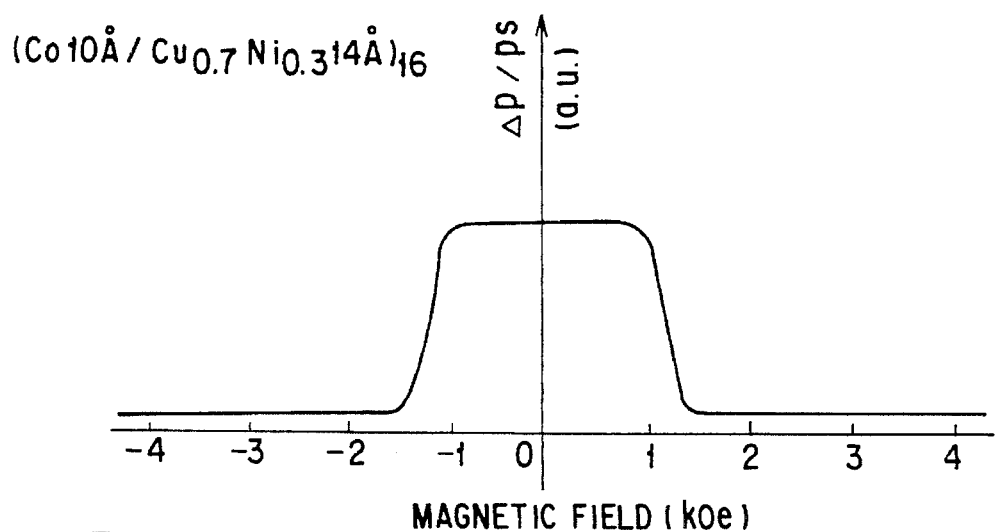
FIGS. 21A and 21B are respectively graphs showing the magnetoresistance effects of Co/Cu$_{1-x}$Ni$_x$ artificial lattice films in Example 3.
Figure 21B:
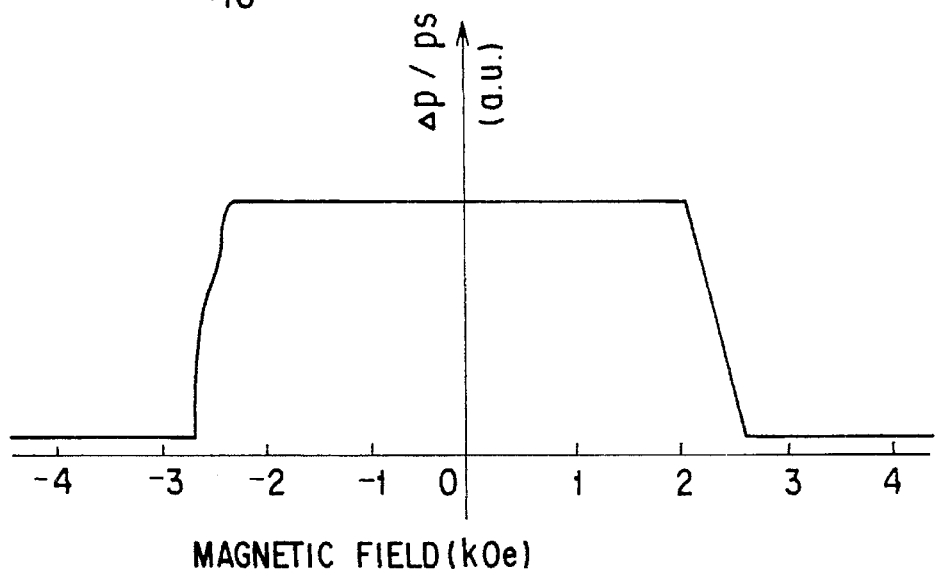

FIG. 21A shows the magnetoresistance effect result of $(Co 10\text{Å}/Cu_{0.7}Ni_{0.3} 14\text{Å})_{16}$. As a comparative example, the magnetoresistance effect curve of $(Co 11\text{Å}/Cu 11\text{Å})_{16}$ not containing Ni is shown in FIG. 21B. The magnetoresistance change $\Delta\rho$ of $(Co 11\text{Å}/Cu 11\text{Å})_{16}$ was 7.3 μΩ·cm, and the magnetoresistance change $\Delta\rho$ of $(Co 10\text{Å}/Cu_{0.7}Ni_{0.3} 14\text{Å})_{16}$ was 5.4 μΩ·cm which was slightly lower than that of $(Co 11\text{Å}/Cu 11\text{Å})_{16}$. The saturation magnetic field of $(Co 11\text{Å}/Cu 11\text{Å})_{16}$ was 2.75 kOe, and the saturation magnetic field of $(Co 10\text{Å}/Cu_{0.7}Ni_{0.3} 14\text{Å})_{16}$ was 1.45 kOe, which was found to be about ½ that of $(Co 11\text{Å}/Cu 11\text{Å})_{16}$.

Figure 22:
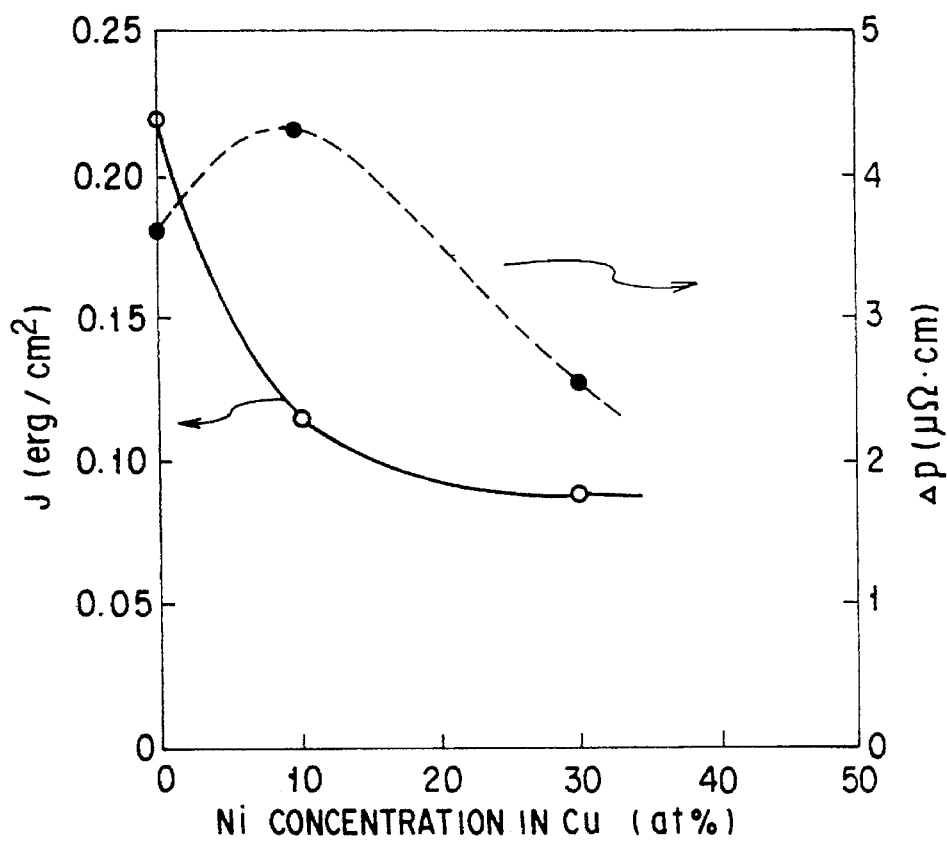
FIG. 22 is a graph showing a change Δρ in magnetoresistance as a function of the Ni concentration and a negative interaction J acting between the layers in the Co/Cu$_{1-x}$Ni$_x$ artificial lattice film in Example 3.

FIG. 22 shows an interlayer interaction J and a magnetoresistance change $\Delta\rho$(=[Resistivity in Saturation Magnetic Field]−[Resistivity in Zero Magnetic Field]) upon a change in Ni content x in $(Co t_{co}/Cu_{1-x}Ni_x t_{cu})_n$. In this case, the thickness $t_{co}$ of each Co layer fell within the range of 10Å to 11Å, and the thickness $t_{cu}$ of the $Cu_{1-x}Ni_x$ layer had a value corresponding to a maximum magnetoresistance ratio. The magnetoresistance change $\Delta\rho$ has a maximum value in accordance with the magnetic randomness at the interface when x is 10 atm %. The magnetoresistance change is reduced when x is increased. On the other hand, J is almost saturated when x is about 20 atm %. The Ni content is controlled to reduce the saturation magnetic field without reducing the magnetoresistance ratio because the saturation magnetic field is generally proportional to the magnitude of the interaction J.

Figure 23:
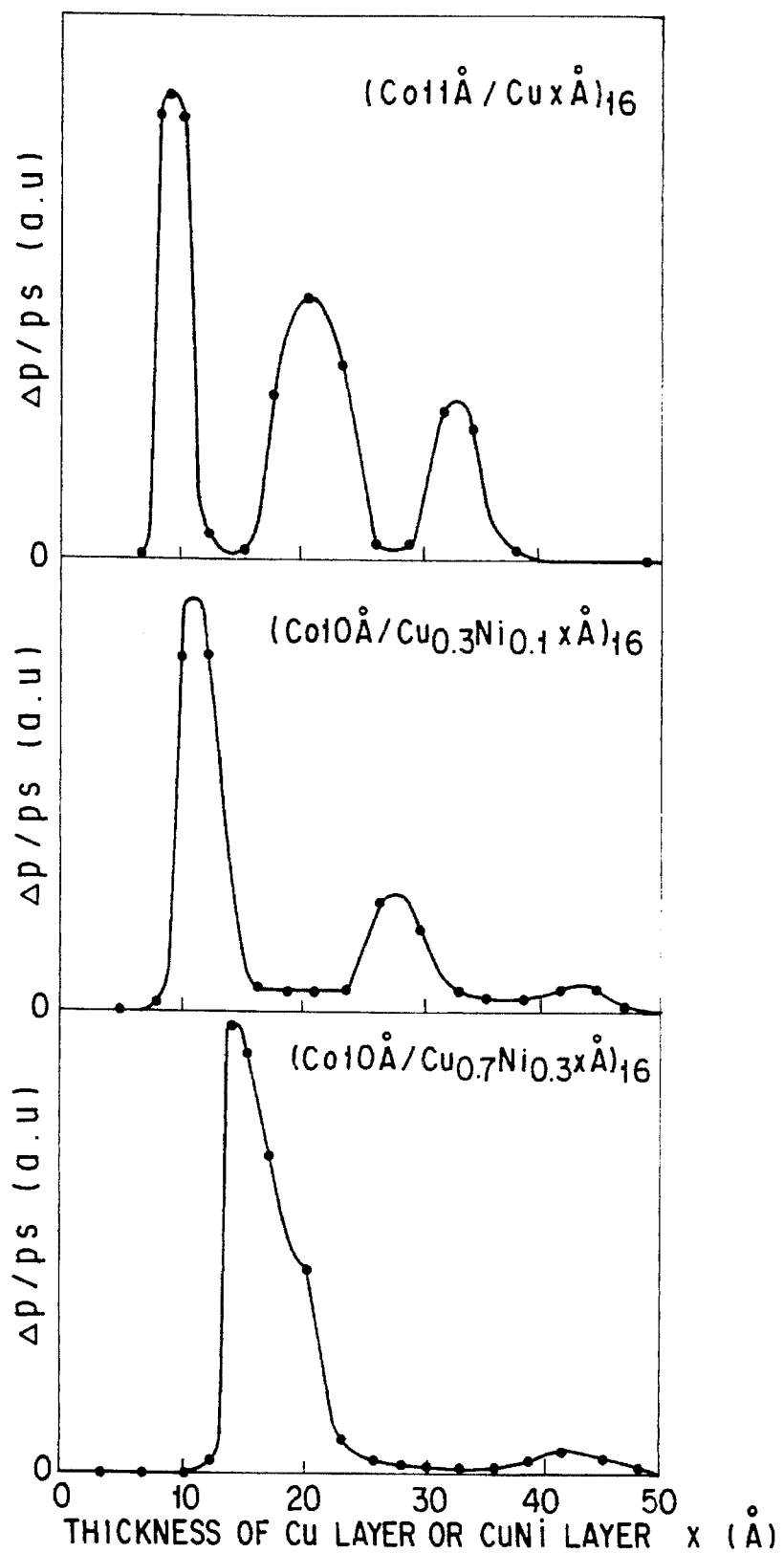
FIG. 23 is a graph showing nonmagnetic layer thickness dependencies of the magnetoresistance effect in Example 3.
Figure 26:
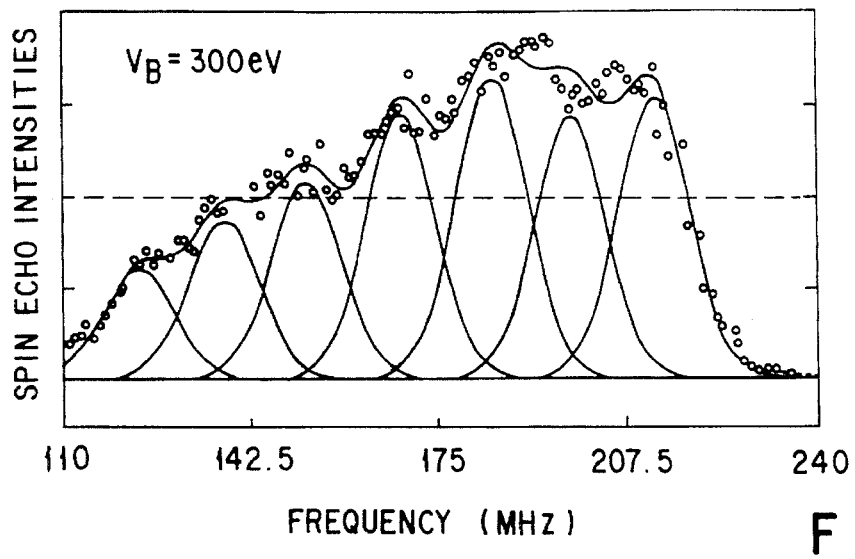
Figure 27:
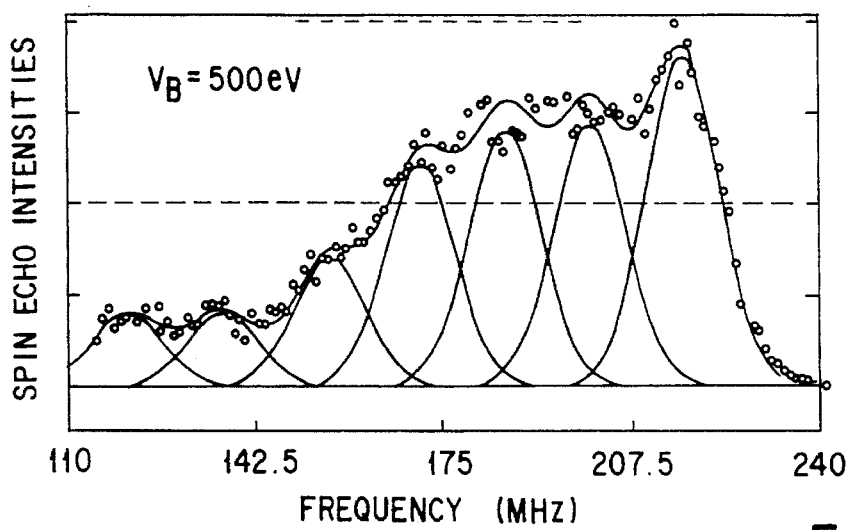
Figure 28:
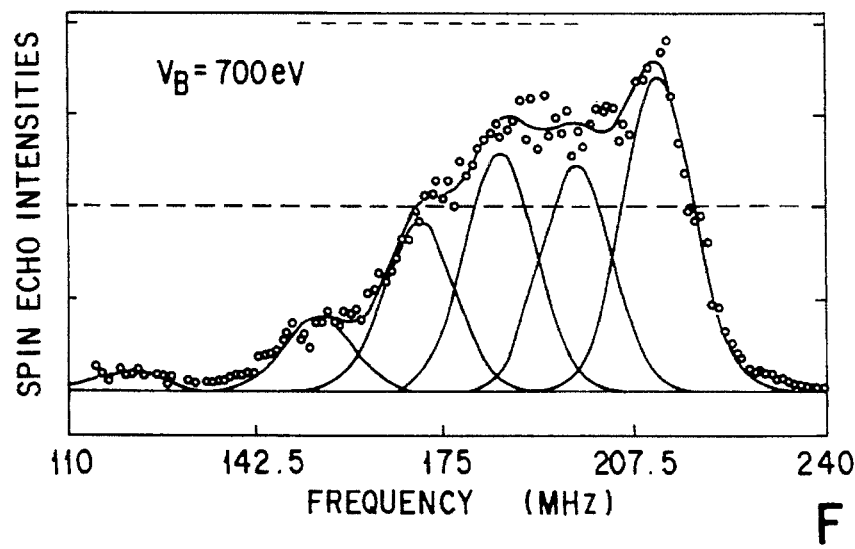
Figure 31:
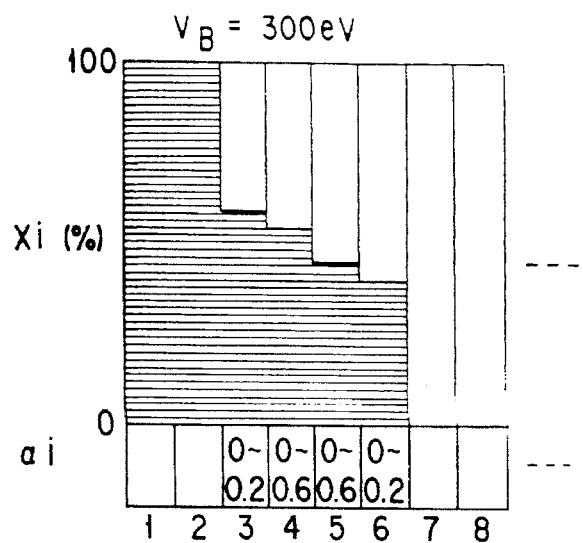
Figure 32:
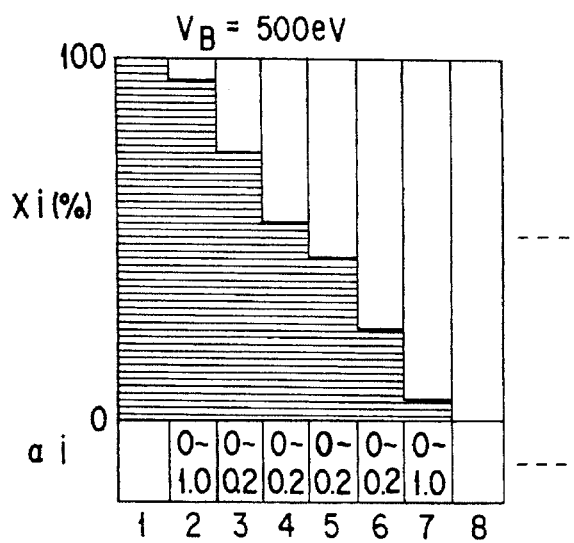
Figure 33:
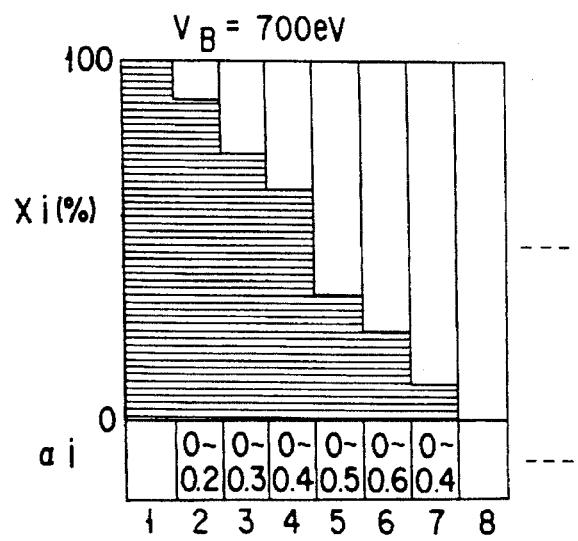

FIG. 23 shows the non-magnetic layer thickness dependency of the magnetoresistance effect. A plot (a) represents this dependency in a Co/Cu artificial lattice illustrated for a reference, and plots (b) and (c) represent the dependencies in Co/CuNi artificial lattice. The first peak position is shifted and the vibration period is also changed by Ni addition. It is thus apparent that a film thickness suitable for obtaining a magnetoresistance effect can be arbitrarily changed by the additive element.

EXAMPLE 4

Example 4 corresponding to the third embodiment will be described below.

An artificial lattice film of $Co/Cu_{1-x}Ni_x/Cu/Cu_{1-x}Ni_x$ was formed on a substrate using an ion beam sputtering apparatus. A chamber was evacuated to a degree of vacuum of $2 \times 10^{-7}$ Torr, and an Ar gas was supplied to the ion gun until the partial pressure reached $1 \times 10^{-4}$ Torr. The Ar gas was ionized and was radiated on targets at an acceleration voltage of 700 eV. The targets were a total of three targets, i.e., Co and Cu targets and two $Cu_{1-x}Ni_x$ targets. These targets were rotated every predetermined period of time to obtain artificial lattice films each having a multilayered structure of $16 \times Co/Cu_{1-x}Ni_x/Cu/Cu_{1-x}Ni_x$. In this case, $Cu_{0.86}Ni_{0.14}$ and $Cu_{0.77}Ni_{0.23}$ layers were used as $Cu_{1-x}Ni_x$.

The substrate was an MgO (110) substrate, and the substrate temperature was room temperature.

FIG. 24 shows a change in $\Delta\rho$ at 77K when the thickness of each Co layer is set to 10Å and the thickness of each $Cu_{1-x}Ni_x$ layer is changed from 0 to 6Å such that the total thickness of $Co/Cu_{1-x}Ni_x/Cu/Cu_{1-x}Ni_x$ corresponds to the first peak of anti-ferromagnetic coupling. The thickness of $Cu_{1-x}Ni_x$ is zero because the non-magnetic layer is a single Cu layer and the non-magnetic layer of $Cu_{0.86}Ni_{0.14}$5.5Å is a single $Cu_{0/86}Ni_{0.14}$ layer. Similarly, $Cu_{0.77}Ni_{0.23}$6Å represents that the non-magnetic layer is a $CU_{0.77}Ni_{0.23}$ layer.

When an alloy layer was inserted at about 2Å wide interface in a CuNi alloy having X=0.14 or 0.23, the magnetoresistance change $\Delta\rho$ was larger than that ($\Delta\rho Cu$) of Co/Cu. In particular, when x=0.14, the magnetoresistance change $\Delta\rho$ of the CuNi alloy reached 1.3 times or more that ($\Delta\rho Cu$) of Co/Cu.

when the thickness of the alloy layer exceeded 2Å, a large $\Delta\rho$ could be maintained at a low Ni concentration. However, when the Ni concentration was high, the magnetoresistance change $\Delta\rho$ was gradually reduced.

EXAMPLE 5

An artificial lattice film having a multilayered structure of 16×[Co(10Å)/$Cu_{1-x}Z_x$(2Å)/Cu( 5Å–7Å)/$Cu_{1-x}Z_x$(2Å)] was manufactured following the same procedures as in Example 4. Additive elements Z in the non-magnetic layer were Fe, Co, Pt, and Pd each in an amount of 10 atm % to 20 atm %. The magnetoresistance changes $\Delta\rho$ of the respective artificial lattice films which are normalized with Co/Cu$\Delta\rho$ ($\Delta\rho_{Cu}$) are shown in Table 5. In each case, the magnetoresistance change $\Delta\rho$ of the artificial lattice film is larger than that of Co/Cu. It is thus apparent that insertion of an impurity-doped non-magnetic layer is effective.

TABLE 5

| Impurity Element | $\Delta\rho/\Delta\rho_{Cu}$ |
| --- | --- |
| Fe | 1.29 |
| Co | 1.35 |
| Pt | 1.08 |
| Pd | 0.17 |

EXAMPLE 6

In this Example, a Co film having a thickness of 1 nm used as a magnetic layer $M_1$ made of a ferromagnetic material, a $Ni_8Fe_2$ film having a thickness of 2 nm used as a magnetic layer $M_2$, a Cu film having a thickness of 5 nm used as a non-magnetic layer N, a mixture layer $C_1$ of Co and Cu, and a mixture layer $C_2$ of $Ni_8Fe_2$ and Cu, were stacked on a substrate in the order of $M_1/C_1/N/C_2/M_2$, thereby forming a Shinjo type multilayer. The conditions for formation of film were similar to those of Example 2.

Then, five types of multilayers having the above layer structure were obtained by variable acceleration voltages ($V_B$) of the ion beam sputtering apparatus, that is, 300 eV, 500 eV, 700 eV, 1 keV and 1.4 keV. The magnetoresistance ratios of these multilayers were 0.2%, 4%, 6%, 5% and 0.2%.

FIGS. 26–30 each illustrates the frequency dependency of the NMR spin echo signal of the respective one of the five types of multilayers.

These multilayers were analyzed in the same manner as in Example 2, and the concentration distribution of the mixture layers was obtained. FIGS. 31–35 each illustrates the concentration distribution of the respective one of multilayers.

Judging from the results, it can be confirmed that when the ratio between the magnetic atom concentration $X_1$% of the atomic layer closest to the magnetic layer and the magnetic atom concentration $X_n$% of the n-th atomic layer closest to the Cu layer, i.e. $2X(X_1/X_n)/n$, is larger than 1.1, and $X_1>60$% or $X_n>40$%, in other words, when the concentration gradient of the magnetic layer of the mixture layer is steep, a large magnetoresistance ratio is obtained.

This correlation did not depend on the type of the magnetic layer or non-magnetic layer.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetoresistance effect element comprising a multilayer stack of alternating magnetic and non-magnetic layers, and having a mixture layer constituted by a mixture of a ferromagnetic element and a non-ferromagnetic element interposed between adjacent stacked magnetic and non-magnetic layers so as to exhibit a magnetoresistance effect, wherein said multilayer stack includes at least two said magnetic layers, at least two said mixture layers, and at least one said non-magnetic layer, and wherein $2(X_1/X_n)/n$ is larger than 1.1 where n is the number of atomic layers of said mixture layer, $X_1$ is an atomic concentration (%) of said ferromagnetic element of an atomic layer closest to said magnetic layer, and $X_n$ is an atomic concentration (%) of said ferromagnetic element of the n-th atomic layer closest to said non-magnetic layer.

2. An element according to claim 1, wherein said magnetic layer contains a material selected from the group consisting of Co, Fe, Ni, and alloys thereof.

3. An element according to claim 1, wherein said non-magnetic layer contains a material selected from the group consisting of Cu, Cr, Au, Ag, Ru, and alloys thereof.

4. An element according to claim 1, wherein said magnetic layer has a thickness of 2Å to 100Å.

5. An element according to claim 4, wherein said magnetic layer has a thickness of 4Å to 80Å.

6. An element according to claim 1, wherein said non-magnetic layer has a thickness of 2Å to 100Å.

7. An element according to claim 6, wherein said non-magnetic layer has a thickness of 9Å to 50Å.

8. An element according to claim 1, wherein the $2(X_1/X_n)/n$ is larger than 1.5.

9. An element according to claim 1, wherein the $X_1$ is larger than 60%.

10. An element according to claim 1, wherein the $X_n$ is smaller than 40%.

11. An element according to claim 1, wherein said mixture layer has a thickness of 1.2Å to 10Å.

12. An element according to claim t, wherein when a probability $P(X_1)$ of magnetic atoms being concentrated around a magnetic atom in said mixture layer is represented by equation (1) below, $\alpha_1$ in equation (1) satisfies $-0.3 \leq \alpha_1 \leq 1.0$:

$$P(X_1)=X_1+\alpha_1(1-X_1) \tag{1}$$

where $X_1$ is a concentration of magnetic atoms of an i-th layer of said mixture layer, and $\alpha_1$ is an order parameter represents a degree of localization in $-1 \leq \alpha_1 \leq 1$ condition $\alpha_1=0$ represents a random atomic arrangement, condition $\alpha_1<0$ represents an order state, and condition $\alpha_1>0$ represents formation of a cluster.

13. An element according to claim 1, further comprising a bias applying layer for applying bias magnetic field to said multilayer.

14. A magnetoresistance effect element comprising a multilayer stack of alternating magnetic layers and at least one non-magnetic layer, said at least one non-magnetic layer containing a metal element or an alloy thereof wherein said metal element or alloy thereof is magnetically polarized in a non-ferromagnetic matrix metal material due to the presence of said magnetic layer, said multilayer exhibiting a magnetoresistance effect.

15. An element according to claim 14, wherein said magnetic layer contains a material from the group consisting of Co, Fe, Ni, and alloys thereof.

16. An element according to claim 14, wherein said metal element magnetically polarized contains material selected from the group consisting of Ni, Mn, Pt, Pd, Rh, Co, and Fe.

17. An element according to claim 14, wherein said matrix metal contains a material selected from the group consisting of Cu, Au, Ag, Mo, Nb, and Al.

18. An element according to claim 14, comprising 2–20 atm % of said magnetically polarized metal element or an alloy thereof in said non-magnetic layer.

19. An element according to claim 14, wherein said magnetic layer has a thickness of 2Å to 100Å.

20. An element according to claim 14, wherein said non-magnetic layer has a thickness of 2Å to 100Å.

21. An element according to claim 14, further comprising a bias applying layer for applying bias magnetic field to said multilayer.

22. A magnetoresistance effect element comprising a multilayer stack of alternating magnetic layers and at least one first non-magnetic layer, and having second non-magnetic layers interposed between adjacent magnetic and first non-magnetic layers, wherein said second non-magnetic layers contain a metal element or an alloy thereof wherein said metal element or alloy thereof is magnetically polarized in a non-ferromagnetic matrix metal material due to the presence of said magnetic layer, said multilayer exhibiting a magnetoresistance effect.

23. An element according to claim 22, wherein said magnetic layer contains a material selected from the group consisting of Co, Fe, Ni and alloys thereof.

24. An element according to claim 22, wherein said first non-magnetic layer contains a material selected from the group consisting of Cu, Au, Ag, Mo, Nb, and Al.

25. An element according to claim 22, wherein said metal element magnetically polarized in said second non-magnetic layer contains a material selected from the group consisting of Ni, Mn, Pt, Pd, Rh, Co, and Fe.

26. An element according to claim 22, wherein said matrix metal in said second non-magnetic layer contains a material selected from the group consisting of Cu, Au, Ag, Mo, Nb, and Al.

27. An element according to claim 22, wherein said second non-magnetic layer contains said magnetically polarized metal element or an alloy thereof in an amount of not more than 50 atm %.

28. An element according to claim 22, wherein said magnetic layer has a thickness of 4Å to 100Å.

29. An element according to claim 22, wherein said first non-magnetic layer has a thickness of 5Å to 80Å.

30. An element according to claim 22, wherein said second non-magnetic layer has a thickness of 1Å to 5Å.

31. An element according to claim 22, further comprising a bias applying layer for applying bias magnetic field to said multilayer.

* * * * *